(12) United States Patent
Kasahara et al.

(10) Patent No.: US 8,097,891 B2
(45) Date of Patent: Jan. 17, 2012

(54) GROUP III NITRIDE SEMICONDUCTOR LIGHT EMITTING DEVICE AND METHOD FOR PRODUCING THE SAME

(75) Inventors: Kenji Kasahara, Tsukuba (JP);
Kazumasa Ueda, Tsuchiura (JP);
Yoshinobu Ono, Tsukubamirai (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 305 days.

(21) Appl. No.: 12/223,986

(22) PCT Filed: Feb. 13, 2007

(86) PCT No.: PCT/JP2007/052910
§ 371 (c)(1),
(2), (4) Date: Aug. 14, 2008

(87) PCT Pub. No.: WO2007/094490
PCT Pub. Date: Aug. 23, 2007

(65) Prior Publication Data
US 2010/0155754 A1    Jun. 24, 2010

(30) Foreign Application Priority Data

Feb. 16, 2006 (JP) .................................. 2006-039067

(51) Int. Cl.
*H01L 33/00* (2010.01)
(52) U.S. Cl. ................ 257/98; 438/29; 438/46; 438/45; 438/433; 257/E33.067; 257/E21.211; 257/99; 257/E33.064; 257/E33.025

(58) Field of Classification Search .................... 438/29, 438/46, 45, 433; 257/98, E33.067, E21.211, 257/99, 103, E33.064, E33.025, E33.066, 257/E33.045
See application file for complete search history.

(56) References Cited

U.S. PATENT DOCUMENTS 4,279,244 A * 7/1981 McAlister ..................... 126/621
5,126,804 A * 6/1992 Nagai et al. ..................... 257/14
(Continued)

FOREIGN PATENT DOCUMENTS

CN         1433088 A1    7/2003
(Continued)

OTHER PUBLICATIONS

Windisch et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.

*Primary Examiner* — N Drew Richards
*Assistant Examiner* — Ankush K Singal
(74) *Attorney, Agent, or Firm* — Fitch, Even, Tabin & Flannery

(57) ABSTRACT

The present invention provides a group III nitride semiconductor light emitting device and a method for producing the same. The group III nitride semiconductor light emitting device comprises (a1), (b1) and (c1) in this order: (a1) an N electrode, (b1) a semiconductor multi-layer film, (c1) a transparent electric conductive oxide P electrode, wherein the semiconductor multi-layer film comprises an N-type semiconductor layer, light emitting layer, P-type semiconductor layer and high concentration N-type semiconductor layer having an n-type impurity concentration of $5 \times 10^{18}$ cm$^{-3}$ to $5 \times 10^{20}$ cm$^{-3}$ in this order, the N-type semiconductor layer is in contact with the N electrode, and the semiconductor multi-layer film has a convex.

20 Claims, 16 Drawing Sheets

(a) OVERALL PERSPECTIVE VIEW OF LIGHT EXTRACTION SURFACE SIDE (b) ENLARGED VIEW OF SEMICONDUCTOR LAYER STRYCTURE (C) ENLARGED VIEW OF CONVEX PORTION

U.S. PATENT DOCUMENTS

| | | | | |
|---|---|---|---|---|
| 5,255,280 | A * | 10/1993 | Harui et al. | 372/46.01 |
| 5,379,314 | A * | 1/1995 | Nemoto et al. | 372/46.01 |
| 5,383,215 | A * | 1/1995 | Narui et al. | 372/46.01 |
| 5,510,156 | A * | 4/1996 | Zhao | 427/534 |
| 5,767,534 | A * | 6/1998 | Chien et al. | 257/91 |
| 6,107,644 | A * | 8/2000 | Shakuda et al. | 257/79 |
| 6,114,212 | A * | 9/2000 | Lee et al. | 438/309 |
| 6,156,584 | A * | 12/2000 | Itoh et al. | 438/33 |
| 6,258,618 | B1 * | 7/2001 | Lester | 438/46 |
| 6,420,732 | B1 * | 7/2002 | Kung et al. | 257/79 |
| 6,495,862 | B1 * | 12/2002 | Okazaki et al. | 257/103 |
| 6,504,180 | B1 * | 1/2003 | Heremans et al. | 257/98 |
| 6,512,248 | B1 * | 1/2003 | Takeuchi et al. | 257/81 |
| 6,765,234 | B2 * | 7/2004 | Koide | 257/88 |
| 6,774,466 | B1 * | 8/2004 | Kajiwara et al. | 257/673 |
| 6,809,340 | B2 * | 10/2004 | Kato et al. | 257/79 |
| 6,844,572 | B2 * | 1/2005 | Sawaki et al. | 257/94 |
| 6,884,647 | B2 * | 4/2005 | Sakai et al. | 438/30 |
| 6,900,473 | B2 * | 5/2005 | Yoshitake et al. | 257/95 |
| 6,903,374 | B2 * | 6/2005 | Katayama | 257/79 |
| 6,927,423 | B2 * | 8/2005 | Sawaki et al. | 257/95 |
| 6,927,820 | B2 * | 8/2005 | Jang et al. | 349/114 |
| 6,936,860 | B2 | 8/2005 | Sung et al. | |
| 6,958,498 | B2 * | 10/2005 | Shelton et al. | 257/99 |
| 7,029,592 | B2 * | 4/2006 | Frendt | 216/42 |
| 7,037,738 | B2 | 5/2006 | Sugiyama et al. | |
| 7,075,115 | B2 * | 7/2006 | Sakamoto et al. | 257/98 |
| 7,102,175 | B2 * | 9/2006 | Orita | 257/97 |
| 7,161,188 | B2 | 1/2007 | Orita | |
| 7,348,600 | B2 * | 3/2008 | Narukawa et al. | 257/79 |
| 7,423,284 | B2 * | 9/2008 | Nagai et al. | 257/21 |
| 7,858,963 | B2 * | 12/2010 | Ueno et al. | 257/14 |
| 2001/0048113 | A1 * | 12/2001 | Kim | 257/98 |
| 2002/0063256 | A1 * | 5/2002 | Lin | 257/79 |
| 2002/0079498 | A1 | 6/2002 | Koide et al. | |
| 2002/0179918 | A1 | 12/2002 | Sung et al. | |
| 2003/0062530 | A1 * | 4/2003 | Okazaki et al. | 257/79 |
| 2003/0173568 | A1 | 9/2003 | Asakawa et al. | |
| 2003/0178626 | A1 * | 9/2003 | Sugiyama et al. | 257/79 |
| 2004/0048409 | A1 * | 3/2004 | Biwa et al. | 438/46 |
| 2004/0115846 | A1 * | 6/2004 | Otake et al. | 438/22 |
| 2004/0145865 | A1 | 7/2004 | Lin | |
| 2004/0171183 | A1 * | 9/2004 | Kang et al. | 438/29 |
| 2005/0040413 | A1 * | 2/2005 | Takahashi et al. | 257/96 |
| 2005/0082547 | A1 * | 4/2005 | Chang et al. | 257/79 |
| 2005/0082562 | A1 * | 4/2005 | Ou et al. | 257/103 |
| 2005/0093002 | A1 * | 5/2005 | Tsai et al. | 257/79 |
| 2005/0093008 | A1 * | 5/2005 | Suehiro et al. | 257/98 |
| 2005/0145860 | A1 * | 7/2005 | Tanizawa | 257/85 |
| 2005/0208686 | A1 | 9/2005 | Ryu et al. | |
| 2005/0221520 | A1 * | 10/2005 | Ou et al. | 438/29 |
| 2006/0054907 | A1 * | 3/2006 | Lai | 257/96 |
| 2006/0073692 | A1 * | 4/2006 | Yoshida et al. | 438/605 |
| 2006/0231852 | A1 | 10/2006 | Kususe et al. | |
| 2006/0273333 | A1 * | 12/2006 | Wu et al. | 257/94 |
| 2007/0029541 | A1 * | 2/2007 | Xin et al. | 257/14 |
| 2007/0114511 | A1 * | 5/2007 | Kim et al. | 257/13 |
| 2008/0149952 | A1 | 6/2008 | Kasahara et al. | |
| 2009/0206320 | A1 * | 8/2009 | Chua et al. | 257/13 |
| 2010/0197055 | A1 * | 8/2010 | Tanaka et al. | 438/29 |

FOREIGN PATENT DOCUMENTS

| | | |
|---|---|---|
| JP | 08-102458 A | 4/1996 |
| JP | 8-102548 | 4/1996 |
| JP | 8-195505 | 7/1996 |
| JP | 08-195505 A | 7/1996 |
| JP | 2001-274458 | 10/2001 |
| JP | 2002-9335 | 1/2002 |
| JP | 2002-198560 | 7/2002 |
| JP | 2003-60236 | 2/2003 |
| JP | 2003-060236 A | 2/2003 |
| JP | 2003-218383 | 7/2003 |
| JP | 2003-258296 | 9/2003 |
| JP | 2003-347585 | 12/2003 |
| JP | 2004-71644 | 3/2004 |
| JP | 2004-288799 | 10/2004 |
| JP | 2005/064113 A | 3/2005 |
| JP | 2005/117006 A | 4/2005 |
| JP | 2005-268739 | 9/2005 |
| JP | 2006-049855 A | 2/2006 |
| WO | WO2005/004247 | 1/2005 |

* cited by examiner (a) NON-PERIODIC CONFIGURATION (b) PERIODIC CONFIGURATION (a)

(b)

GROUP III NITRIDE SEMICONDUCTOR LIGHT EMITTING DEVICE AND METHOD FOR PRODUCING THE SAME

CROSS-REFERENCE TO RELATED APPLICATIONS

This is a U.S. National Phase of International Application PCT/JP2007/052910, filed Feb. 13, 2007, and claims the benefit of priority under 35 U.S.C. §119 based on Japanese Application No. 2006-039067, filed Feb. 16, 2006, the entire disclosures of which applications are hereby incorporated herein by reference.

TECHNICAL FIELD

The present invention relates to a group III nitride semiconductor light emitting device and a method for producing the same. More particularly, the present invention relates to a nitride compound semiconductor light emitting device of the formula $In_xGa_yAl_zN$ (wherein, $x+y+z=1$, $0 \leq x \leq 1$, $0 \leq y \leq 1$, $0 \leq z \leq 1$) and a method for producing the same.

BACKGROUND ART

Group III-V nitride-based semiconductor light emitting devices are used as a light source for various displays and illumination apparatuses. Use as a light source for indoor optical communication is also investigated. In applying group III-V nitride-based semiconductor light emitting devices to these uses, enhancement of light emission efficiency is a problem.

For enhancing the light emission efficiency of a light emitting device, required are (1) suppression of nonradiative center by a device structure enhancing recombination rate of electrons and holes or by reduction of dislocation and defect densities of a semiconductor crystal (improvement of internal quantum efficiency), and (2) improvement of light extraction efficiency generated in the semiconductor crystal out of the device from the semiconductor (improvement of light extraction efficiency). With respect to the latter case, only lights showing angles of not more than the critical angle at the boundary region between a semiconductor and the external environment can be taken out into the exterior, and lights showing angles of not less than the critical angle are reflected at the boundary region and returned into the interior of the semiconductor and attenuated internally, as explained by the Snell formula.

Group III-V nitride-based semiconductors have a refractive index of not less than 2, and this refractive index is different from the refractive index of a light taking out space or member (for example, atmospheric air having a refractive index of 1, epoxy encapsulating material having a refractive index of 1.5). Thus, in conventional group III-V nitride-based semiconductor light emitting devices, most of lights generated in a light emitting layer show total internal reflection angle condition, and are not taken out into the exterior, and during repetition of multireflection inside of the device, these lights are absorbed in an electrode and the like and attenuated in some cases. In the case of a device having a GaN light emitting layer encapsulated with an epoxy resin like a light emitting diode lamp, the critical angle in taking out lights from GaN to the epoxy resin would be 38° if calculated based on a refractive index 2.5 of GaN and a refractive index 1.5 of the epoxy resin. It is said that since 80% of lights are totally reflected at the boundary region between GaN and epoxy resin encapsulating material and confined in the GaN layer, only 20% of lights generated in the light emitting layer can be utilized.

Therefore, there are conventionally suggested methods for improving light extraction efficiency (JP-A Nos. 2003-258296 and 2003-218383, WO 2005/004247). JP-A Nos. 2003-258296 and 2003-218383 disclose a method in which a resin containing a block polymer or graft co-polymer and forming a micro phase separation structure in self organizing fashion is used on the surface of a GaP-based light emitting device, the micro phase separation structure of a thin film formed on the surface of the light emitting device is removed selectively, and the surface of the light emitting device is etched using residual polymer dots as an etching mask, thereby, fine roughness are formed. WO 2005/004247 discloses a method of etching the surface of an n-type layer of an GaN-based light emitting device using, as an etching mask, the residue naturally generated in dry etching.

However, there has been desired a further improvement in light extraction efficiency of a group III nitride semiconductor light emitting device, and an efficient method for producing a group III nitride semiconductor light emitting device showing high light extraction efficiency has been desired.

DISCLOSURE OF THE INVENTION

The present invention has an object of providing a highly efficient group III nitride semiconductor light emitting device showing improved light extraction efficiency, and a method for producing the same.

The present inventors have intensively studied to solve the above-described problem, resultantly leading to completion of the present invention. That is, the present invention provides a group III nitride semiconductor light emitting device 1 comprising (a1), (b1) and (c1) in this order:
  (a1) an N electrode,
  (b1) a semiconductor multi-layer film,
  (c1) a transparent electric conductive oxide P electrode,
wherein the semiconductor multi-layer film comprises an N-type semiconductor layer, light emitting layer, P-type semiconductor layer and high concentration N-type semiconductor layer having an n-type impurity concentration of $5 \times 10^{18}$ cm$^{-3}$ to $5 \times 10^{20}$ cm$^{-3}$ in this order, the N-type semiconductor layer is in contact with the N electrode, and the semiconductor multi-layer film has a convex.

The present invention provides a group III nitride semiconductor light emitting device comprising (a2), (b2) and (c2):
  (a2) a transparent electric conductive oxide N electrode,
  (b2) a semiconductor multi-layer film,
  (c2) a P electrode,
wherein the semiconductor multi-layer film comprises a high concentration N-type semiconductor layer having an n-type impurity concentration of $5 \times 10^{18}$ cm$^{-3}$ to $5 \times 10^{20}$ cm$^{-3}$, N-type semiconductor layer, light emitting layer and P-type semiconductor layer in this order, the P-type semiconductor layer is in contact with the P electrode, and the semiconductor multi-layer film has a convex.

Further, the present invention provides a method for producing a surface light emitting type semiconductor light emitting device 1 comprising the steps (I-1) to (I-4):
  step (I-1): an N-type semiconductor layer, light emitting layer, P-type semiconductor layer and high concentration N-type semiconductor layer having an n-type impurity concentration of $5 \times 10^{18}$ cm$^{-3}$ to $5 \times 10^{20}$ cm$^{-3}$ are allowed to grow on a substrate to obtain a semiconductor multi-layer film,
  step (I-2): particles having an average particle size of 0.01 μm to 10 μm are placed at an area density of $2 \times 10^6$ cm$^{-2}$ to $2 \times 10^{10}$ cm$^{-2}$ on the high concentration N-type semiconductor layer of the semiconductor multi-layer film, step (I-3): the semiconductor multi-layer film is dry-etched using the particles as an etching mask, to form a convex, step (I-4): a P electrode is formed on the semiconductor multi-layer film.

Furthermore, the present invention provides a method for producing a group III nitride semiconductor light emitting device 2 comprising the steps (II-1) to (II-7):

step (II-1): a high concentration N-type semiconductor layer having an n-type impurity concentration of $5 \times 10^{18}$ cm$^{-3}$ to $5 \times 10^{20}$ cm$^{-3}$, N-type semiconductor layer, light emitting layer and P-type semiconductor layer are allowed to grow in this order on a substrate to obtain a semiconductor multi-layer film, step (II-2): a P electrode is formed on the semiconductor multi-layer film, step (II-3): a support is joined to the P electrode, step (II-4): the substrate is separated from the semiconductor multi-layer film, step (II-5): particles having an average particle size of 0.01 μm to 10 μm are placed at an area density of $2 \times 10^6$ cm$^{-2}$ to $2 \times 10^{10}$ cm$^{-2}$ on the high concentration N-type semiconductor layer of the semiconductor multi-layer film, step (II-6): the semiconductor multi-layer film is dry-etched using the particles as an etching mask, to form a convex, step (II-7): an N electrode is formed on the high concentration N-type semiconductor layer.

Figure 1:
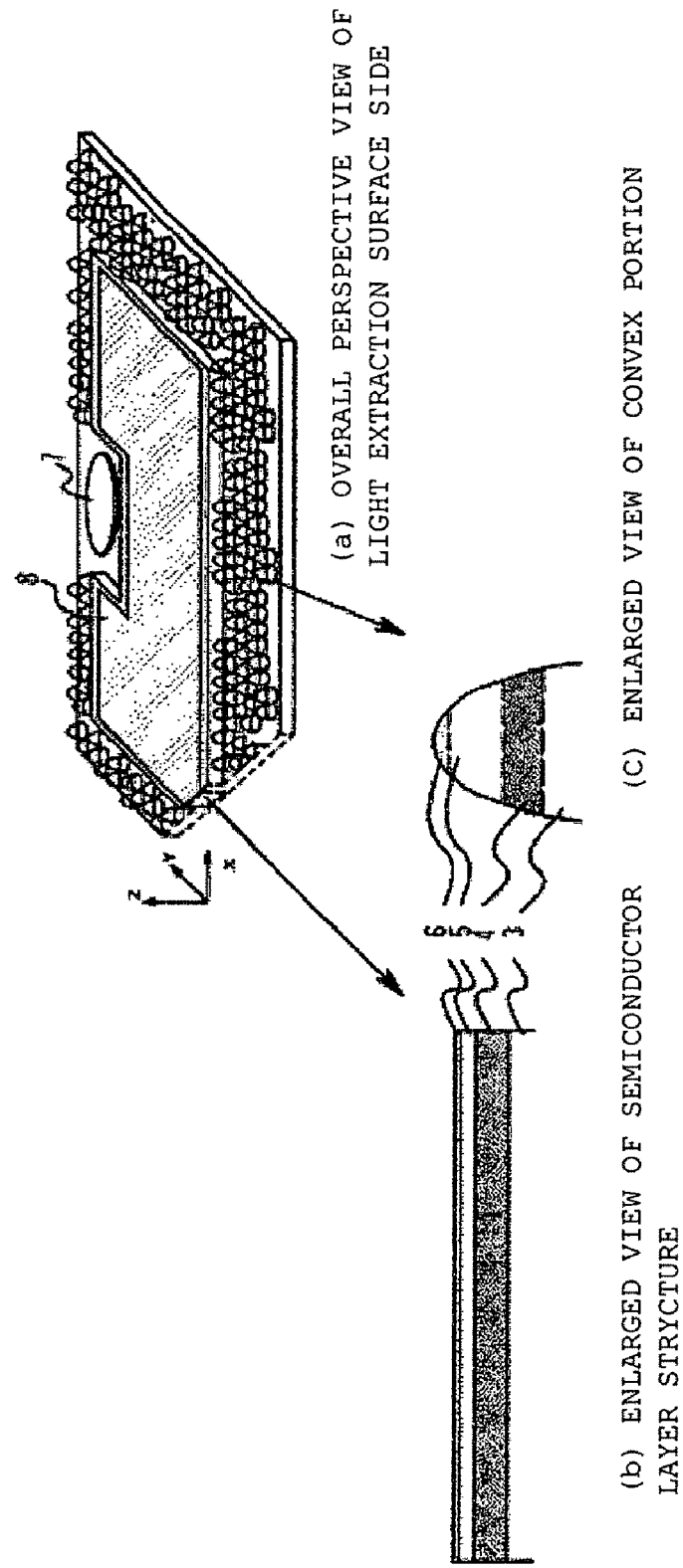
FIG. 1 is a perspective view of a group III nitride semiconductor light emitting device 1.

| EXPLANATION OF MARKS | |
|---|---|
| 1: | substrate |
| 2: | low temperature buffer layer |
| 3: | N-type semiconductor layer |
| 4: | light emitting layer |
| 5: | P-type semiconductor layer |
| 6: | high concentration N-type semiconductor layer |
| 7: | N electrode |
| 8: | P electrode |

MODE OF CARRYING OUT THE INVENTION

Group III Nitride Semiconductor Light Emitting Device 1

The group III nitride semiconductor light emitting device 1 of the present invention (hereinafter, referred to as device 1) has an N electrode, semiconductor multi-layer film and P electrode.

The N electrode is made of, for example, Al, Ti, Al alloy, Ti alloy, Al compound Ti compound, alloy containing Al and Ti, compound containing Al and Ti, or transparent electric conductive oxide such as ITO, ZnO and SnO$_2$, and preferably of Al, Ti/Al, V/Al.

The semiconductor multi-layer film is made of a nitride compound of the formula In$_x$Ga$_y$Al$_z$N (wherein, x+y+z=1, 0≦y≦1, 0≦z≦1), and contains an N-type semiconductor layer, light emitting layer, P-type semiconductor layer and high concentration N-type semiconductor layer in this order.

The N-type semiconductor layer is made of, for example, GaN and has an n-type impurity concentration of $1 \times 10^{18}$ cm$^{-3}$ to $5 \times 10^{18}$ cm$^{-3}$.

The light emitting layer may have any of a single quantum well structure and a multi quantum well structure.

The P-type semiconductor layer usually has a p-type impurity concentration of $1 \times 10^{18}$ cm$^{-3}$ to $5 \times 10^{20}$ cm$^{-3}$. Typically, the p-type impurity concentration of the P-type semiconductor layer near an interface between the p-type semiconductor layer and high concentration N-type semiconductor layer may be advantageously in the above-described range.

The high concentration N-type semiconductor layer has an n-type impurity concentration of $5 \times 10^{18}$ cm$^{-3}$ to $5 \times 10^{20}$ cm$^{-3}$. The high concentration N-type semiconductor layer has a thickness of usually 1 nm to 5 μm, preferably 1 nm to 10 nm. The high concentration N-type semiconductor layer may be any of single layered or multi layered, and in the case of single layer, the high concentration N-type semiconductor layer is, for example, an n-type InGaN layer having a thickness of 5 nm. In contrast, in the case of multi layer, the high concentration N-type semiconductor layer may be, for example, one obtained by laminating n-type GaN layer having a thickness of 1 nm/n-type InGaN layer having a thickness of 1 nm, periodically one to five times.

The device 1 has an effect of spreading current by the P electrode and injecting current into the semiconductor layer, and an effect of suppressing absorption of lights and releasing the lights into the exterior. Thus, the P electrode is made of a transparent electric conductive oxide, preferably, of ITO, ZnO or SnO$_2$. The P electrode may be any of single layered or multi layered. In the P electrode, it is preferable that the value of the product α×d of the thickness (d) and the absorption coefficient (α) is small, and for example, the value is preferably not more than 0.1, from the standpoint of further suppression of light absorption. Further, the P electrode manifests a sheet resistance of preferably not more than 50Ω/□, from the standpoint of spreading current.

A typical structure of the group III nitride semiconductor light emitting device 1 will be explained by FIG. 1.

The group III nitride semiconductor light emitting device 1 has a multi-layered structure containing an N-type semiconductor layer 3, light emitting layer 4, P-type semiconductor layer 5 and high concentration N-type semiconductor extremely thin layer 6 in sequence. The N electrode 7 is in contact with the N-type semiconductor layer 3. The high concentration N-type semiconductor extremely thin layer 6 is sandwiched between a transparent P electrode 8 and the P-type semiconductor layer 5, as shown in FIGS. 1 (a) and (b).

The group III nitride semiconductor light emitting device 1 has a convex composed of the N-type semiconductor layer 3, light emitting layer 4, P-type semiconductor layer 5 and high concentration N-type semiconductor extremely thin layer 6, as shown in FIGS. 1 (a) and (c).

Owing to the existence of the convex, the group III nitride semiconductor light emitting device 1 has an effect by which lights attenuating during repetition of multireflection while being confined in the group III nitride semiconductor light emitting device 1 are taken out from the convex into the exterior efficiently, or an effect by which lights are taken out into the exterior efficiently though the transparent P electrode by changing the reflection angle.

Figure 2:
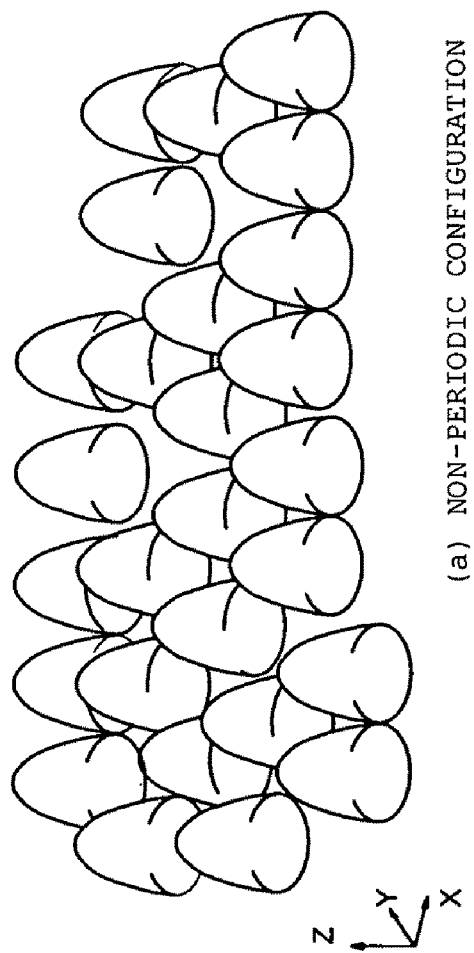
FIG. 2 shows non-periodic configuration and periodic configuration of convexes.
Figure 2:
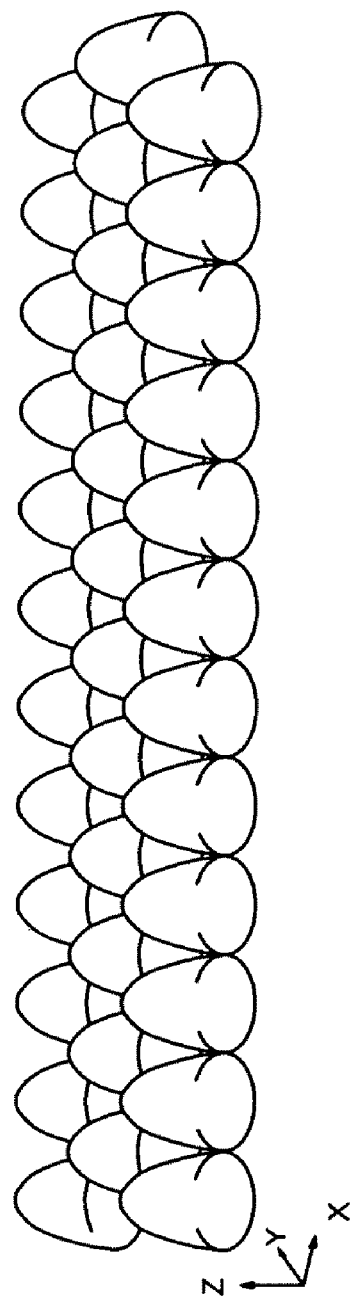
Figure 3:
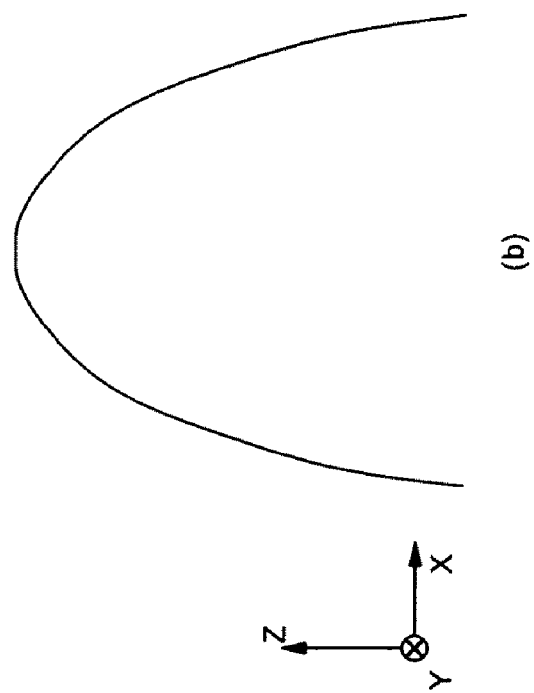
FIG. 3 shows cross-sections of a convex in vertical and horizontal directions with respect to a semiconductor multi-layer film.
Figure 3:
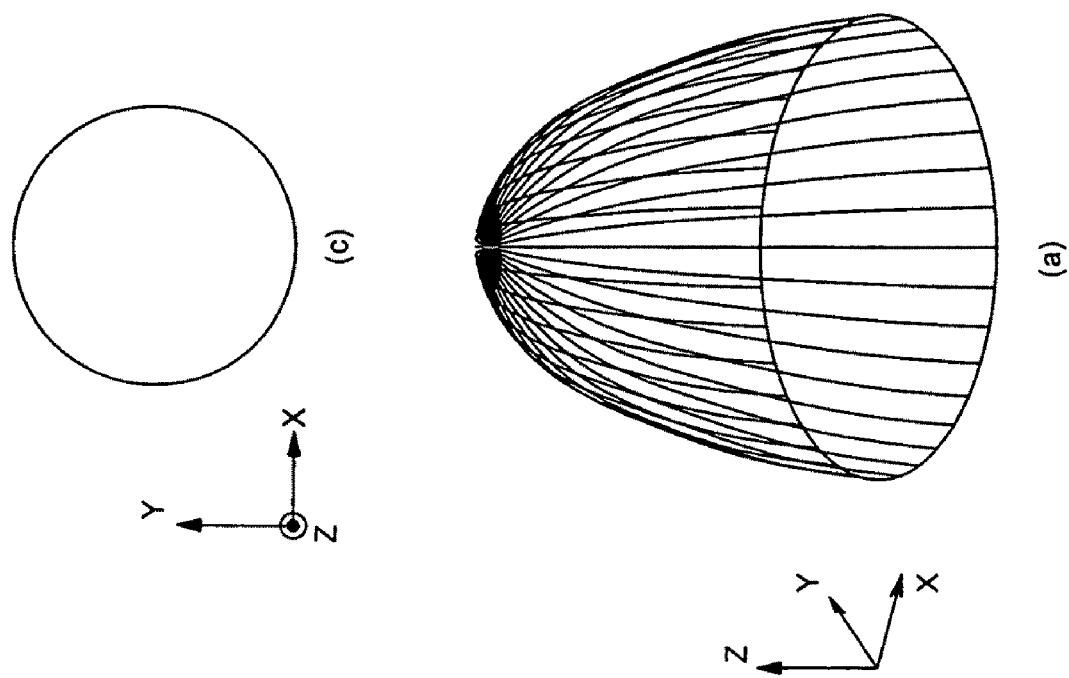

There are usually at least two convexes, and preferably, the shapes and sizes thereof are identical. It is preferable that the convexes show an arrangement of "non-periodic configuration". The "non-periodic configuration" means that there is no two-dimensional periodicity of long periodic convex placement for at least 10 convexes, as shown in FIG. 2 (a). The "non-periodic configuration" does not consider periodicity between nearest convexes and periodicity between second nearest convexes. FIG. 2 (b) shows an example of periodic configuration. The shape of the convex will be illustrated in detail by FIG. 3 (a). As shown in FIG. 3 (c), a cross-section A parallel to the semiconductor multi-layer film is circular, and as shown in FIG. 3 (b), a cross-section B vertical to the semiconductor multi-layer film contains a curved line and the curvature radius thereof increases monotonously from the apex toward peripheral parts.

The convex has an area density of usually $2\times10^6$ cm$^{-2}$ to $2\times10^{10}$ cm$^{-2}$. The area density is the number of convexes with respect to the surface area occupied by the convexes.

It is preferable that the proportion of the surface areas of the convexes occupying with respect to the total surface area of the group III nitride semiconductor light emitting device 1 (hereinafter, referred to as area ratio) is not less than 2.3%.

The total surface area is the area of the boundary region between the group III nitride semiconductor light emitting device 1 and the external environment, and in the case of the group III nitride semiconductor light emitting device 1 in the form of rectangular parallelepiped having a longitudinal length of 300 μm, a lateral length of 300 μm and a thickness of 100 μm, for example, the total surface area is $3\times10^5$ μm$^2$ [=(300×300 μm)×2+(300 μm×100 μm)×4].

In this example, the surface area occupied by the convexes is preferably not less than $6.9\times10^3$ μm$^2$ [=$3\times10^6\times2.3/100$].

Figure 4:
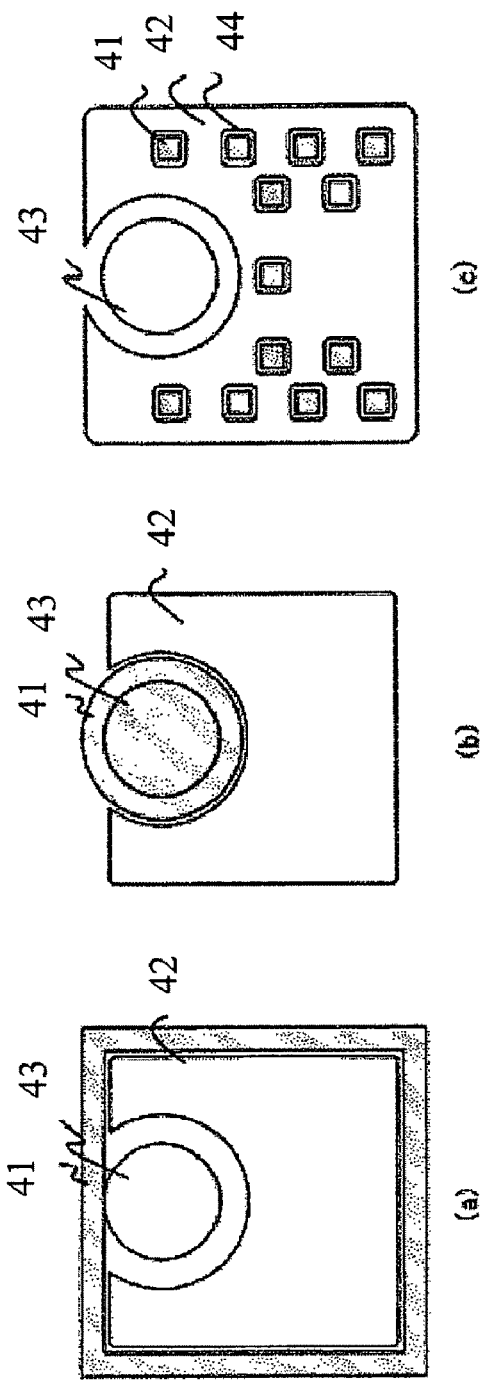
FIG. 4 shows various examples of convex formation regions.

The convex placement will be illustrated by FIG. 4. FIG. 4 is a figure viewed from the surface of taking out light of the group III nitride semiconductor light emitting device 1. With respect to the convex placement, a convex formation region 41 may be present around a transparent P electrode 42 as shown in FIG. 4 (a), may be present on a region overlapping with an N electrode formation region 43 as shown in FIG. 4 (b), or may be present on an aperture 44 of a transparent electrode as shown in FIG. 4 (c). The convexes may also be placed in combination thereof. Of them, it is preferable that a part or all of the convex formation region 41 is present on the N electrode formation region, from the standpoint of improvement of close adherence of the N electrode and the semiconductor layer.

Figure 5:
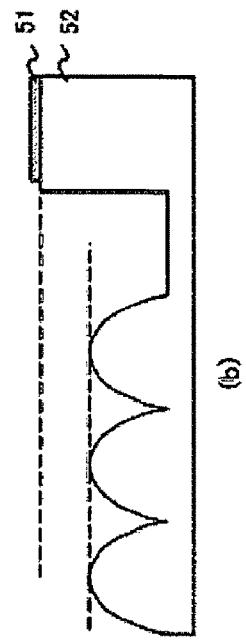
FIG. 5 shows a relation between the convex apex and an interface of semiconductor multi-layer film/electrode.
Figure 5:
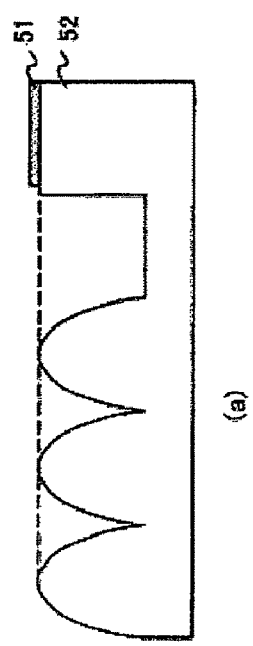

As shown in FIG. 5 (a), it is preferable that a plane obtained by connecting the apexes of the convexes and an interface between the transparent P electrode 51 and the semiconductor multi-layer film 52 are in the same plane. A light emitting device obtained by using thus obtained semiconductor multi-layer film is suitable for high output.

It is advantageous that the group III nitride semiconductor light emitting device 1 is usually processed into chips, and mounted on a package made of a metal, ceramics or resin.

Figure 6:
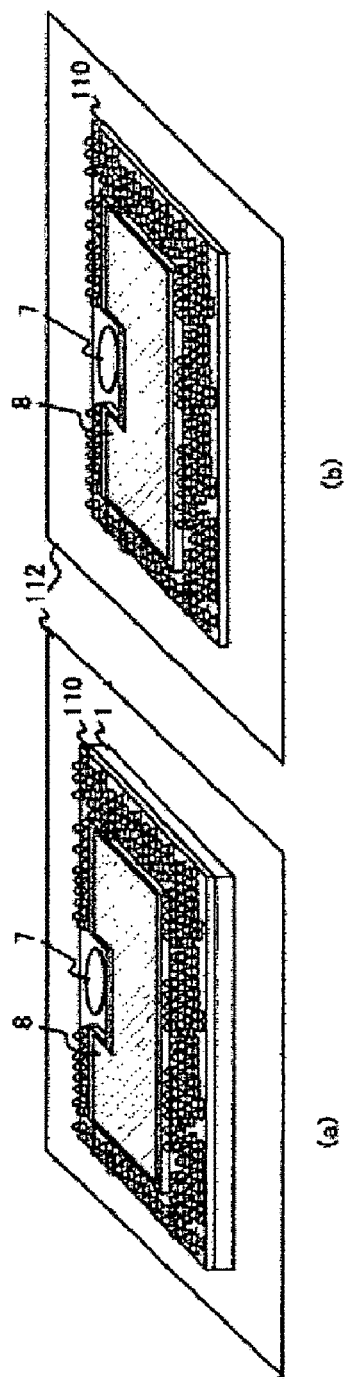
FIG. 6 shows a relation between a group III nitride semiconductor light emitting device 1 and a package.

In the group III nitride semiconductor light emitting device 1, a substrate 111 (for example, single crystal substrate) for crystal growth of semiconductor layer may not be removed and a package 112 is joined to this as shown in FIG. 6 (a), alternatively, a substrate 111 is removed and a package 112 is joined to a semiconductor layer 110 as shown in FIG. 6 (b). In FIG. 6 (a), FIG. 6 (b), the N electrode is represented by 7 and the P electrode is represented by 8, and a pad electrode, wiring to an electrode, and encapsulation resin are omitted.

In the group III nitride semiconductor light emitting device 1, it is preferable that the substrate 111 is removed as shown in FIG. 6 (b) from the standpoint of improvement of heat dissipation, in use of operation at high current density and the like.

Mounting to a package may be advantageously carried out using, for example, a silver paste.

Method for Producing Group III Nitride Semiconductor Light Emitting Device 1

The group III nitride semiconductor light emitting device 1 of the present invention may be advantageously produced by a method containing, for example, the above-described steps (I-1), (I-2), (I-3) and (I-4).

Step (I-1) Growth of Semiconductor Multi-Layer Film

In the step (I-1), an N-type semiconductor layer, light emitting layer, P-type semiconductor layer and high concentration N-type semiconductor layer having an n-type impurity concentration of $5\times10^{18}$ cm$^{-3}$ to $5\times10^{20}$ cm$^{-3}$ are allowed to grow on a substrate to obtain a semiconductor multi-layer film. In the step (I-1), a low temperature buffer layer may be formed, if necessary. The low temperature buffer layer is formed on the substrate, and subsequently, the N-type semiconductor layer is formed thereon.

The substrate is, for example, a single crystal of SiC, Si, MgAl$_2$O$_4$, LiTaO$_3$, ZrB$_2$, CrB$_2$ or GaN, or sapphire, and preferably sapphire.

The low temperature buffer layer is made of, for example, InGaN or GaN, and has a thickness of usually 20 to 80 nm.

The N-type semiconductor layer, light emitting layer, P-type semiconductor layer and high concentration N-type semiconductor layer are as described in the case of the group III nitride semiconductor light emitting device 1 mentioned above.

Growth may be carried out by, for example, MOVPE, HVPE or MBE.

In the case of MOVPE, the following compounds may be used advantageously as a group III material, group V material, n-type dopant material, p-type dopant material, atmospheric gas and carrier gas. Examples of the group III material include trialkyl gallium of the formula $R_1R_2R_3Ga$ ($R_1$, $R_2$, $R_3$ represent a lower alkyl group) such as trimethyl gallium [$(CH_3)_3Ga$, hereinafter, referred to as "TMG"] and triethyl gallium [$(C_2H_5)_3Ga$, "TEG"]; trialkyl aluminum of the formula $R_1R_2R_3Al$ ($R_1$, $R_2$, $R_3$ represent a lower alkyl group) such as trimethyl aluminum [$(CH_3)_3Al$, "TMA"], triethyl aluminum [$(C_2H_5)_3Al$, "TEA"] and triisobutyl aluminum [$(i-C_4H_9)_3Al$]; trimethylamine aluane [$(CH_3)_3N:AlH_3$]; trialkyl indium of the formula $R_1R_2R_3In$ ($R_1$, $R_2$, $R_3$ represent a lower alkyl group) such as trimethyl indium [$(CH_3)_3In$, "TMI"] and triethyl indium [$(C_2H_5)_3In$]; compounds obtained by substitution of one or two alkyl groups of trialkyl indium with a halogen atom such as diethyl indium chloride [$(C_2H_5)_2InCl$]; and indium halides of the formula InX (X represents a halogen atom) such as indium chloride [InCl]. These may be used singly or in admixture. Of them, preferable as the gallium source is TMG, preferable as the aluminum source is TMA and preferable as the indium source is TMI. Examples of the group V material include ammonia, hydrazine, methylhydrazine, 1,1-dimethylhydrazine, 1,2-dimethylhydrazine, t-butylamine and ethylenediamine. These may be used singly or in combination. The group V material includes preferably ammonia and hydrazine, further preferably ammonia since no carbon atom is contained in the molecule and contamination of a semiconductor with carbon can be suppressed. Examples of the n-type dopant material include silane, disilane, German and tetramethyl germanium. Examples of the p-type dopant material include Mg, Zn, Cd, Ca and Be, preferably Mg and Ca. The Mg material to be used as the p-type dopant includes biscyclopentadienyl magnesium [$(C_5H_5)_2$ Mg], bismethylcyclopentadienyl magnesium [$(C_5H_4CH_3)_2$ Mg] and bisethylcyclopentadienyl magnesium [$(C_5H_4C_2H_5)_2$ Mg], and the Ca material thereof includes biscyclopentadienyl calcium [$(C_5H_5)_2Ca$] and derivatives thereof, for example, bismethylcyclopentadienyl calcium [$(C_5H_4CH_3)_2Ca$], bisethylcyclopentadienyl calcium [$(C_5H_4C_2H_5)_2Ca$] and bisperfluorocyclopentadienyl calcium [$(C_5F_5)_2Ca$]; di-1-naphthalenyl calcium and derivatives thereof; calcium acetylide and derivatives thereof, for example, bis(4,4-difluoro-3-butenyl)-calcium, and bisphenylethynyl calcium. These may be used singly or in combination.

Examples of the atmospheric gas and material carrier gas include nitrogen, hydrogen, argon and helium, preferably hydrogen and helium. These may be used singly or in combination. For growth, it may be permissible that a substrate is placed in a reactor, and a material gas is introduced to cause growth of a semiconductor layer on the substrate. The reactor has, for example, a feeding line for feeding a material gas from a material feeding apparatus into the reactor, and a susceptor for heating a substrate in the reactor. A heating apparatus such as an infrared lamp and the like is provided in the susceptor for heating the susceptor. By heating, a material gas fed into the reactor through the feeding line is thermally decomposed on the substrate, to cause growth of a desired compound. Of material gases fed into the reactor, an unreacted material gas is exhausted out of the reactor through an exhaust line, and delivered to an exhaust gas process apparatus.

In the case of HVPE, the following compounds may be used advantageously as a group III material, group V material and carrier gas, and examples of the group III material include a gallium chloride gas produced by reacting a gallium metal with a hydrogen chloride gas at high temperature, and an indium chloride gas produced by reacting an indium metal with a hydrogen chloride gas at high temperature. The group V material is, for example, ammonia. Examples of the carrier gas include nitrogen, hydrogen, argon and helium, preferably hydrogen and helium, and these may be used singly or in admixture.

In the case of MBE, the following compounds may be used advantageously as a group III material, group V material and carrier gas, and examples of the group III material include metals such as gallium, aluminum and indium. Examples of the group V material include nitrogen and ammonia. Examples of the carrier gas include nitrogen, hydrogen, argon and helium, preferably hydrogen and helium. These may be used singly or in admixture.

Figure 7:
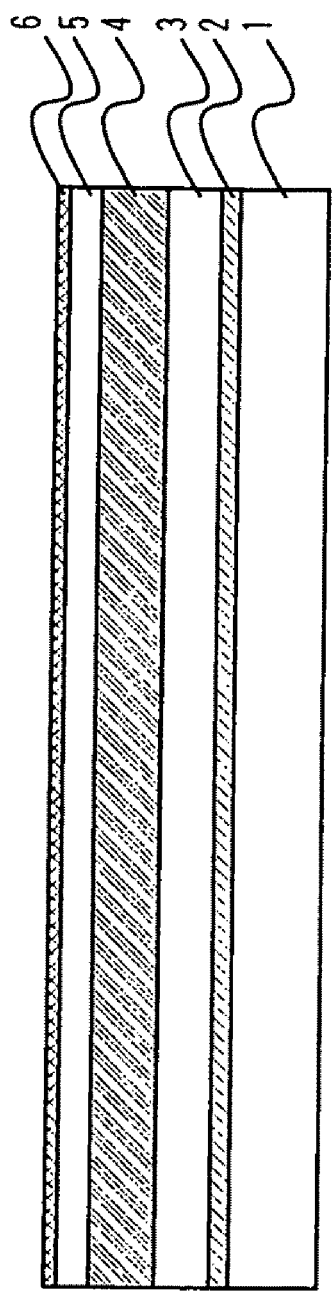
FIG. 7 shows layer structures of a substrate and a semiconductor multi-layer film.
Figure 7:
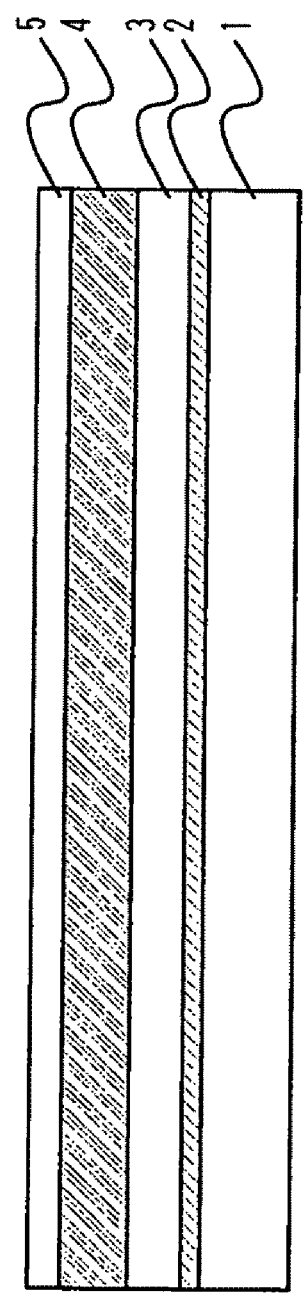

According to the step (I-1), a semiconductor multi-layer film is obtained having a low temperature buffer layer 2, N-type semiconductor layer 3, light emitting layer 4, P-type semiconductor layer 5 and high concentration N-type semiconductor layer 6 formed on a substrate 1, as shown in FIG. 7 (*a*). It is preferable that the semiconductor multi-layer film has a flat surface, from the standpoint of placing particles more uniformly in the step (I-2) described later. In a spin coat method, for example, if there is a step of a size not smaller than the radius of a particle on the surface of the semiconductor multi-layer film, particles overlie at the step part in some cases.

Step (I-2) Placement of Particles

In the step (I-2), particles having an average particle size of 0.01 μm to 10 μm are placed at an area density of $2 \times 10^6$ cm$^{-2}$ to $2 \times 10^{10}$ cm$^{-2}$ on the semiconductor multi-layer film.

Though the particles may be made of an organic material such as polystyrene, the particles are preferably made of an inorganic material. The inorganic material is composed of, for example, an oxide, nitride, carbide, boride, sulfide, selenide and metal. The oxide is silica, alumina, zirconia, titania, ceria, magnesia, zinc oxide, tin oxide, or yttrium aluminum garnet (YAG). The nitride is silicon nitride, aluminum nitride, or boron nitride. The carbide is SiC, boron carbide, diamond, graphite, or fullerene. The boride is $ZrB_2$, or $CrB_2$. The sulfide is zinc sulfide, calcium sulfide, strontium sulfide. The selenide is zinc selenide, or cadmium selenide. These may include partial substitution of constituent elements with other element, and for example, SiAlON containing silicon, aluminum, oxygen and nitrogen may also be permissible. The metal is Si, Ni, W, Ta, Cr, Ti, Mg, Ca, Al, Au, Ag, or Zn. These may be used singly or in combination. The inorganic material may be a nitride covered with an oxide, or a phosphor obtained by introducing an activator such as cerium and europium into an organic material. The inorganic material is preferably an oxide, further preferably silica. The particles are preferably uniform in size and shape thereof since then uniformity of processing shape and processing size in etching is improved and a light emitting device showing high light extraction efficiency can be produced with good reproducibility, and silica particles derived from colloidal silica are preferable because of spherical shape, monodispersity and uniform particle size. The particles have an average particle size of not less than 0.01 μm, preferably not less than 0.05 μm, further preferably not less than 0.1 μm, and not more than 10 μm, preferably not more than 2 μm.

Placement may be advantageously carried out, for example, by a method in which particles are dispersed in a solvent (for example, water, alcohol), a semiconductor multi-layer film is immersed in the resultant slurry, and the film is dried (dipping), or a method in which a slurry is coated or sprayed on a semiconductor multi-layer film, and the film is dried. From the standpoint of placement of particles more uniformly, it is preferable to perform coating by a spin coat method. Placement in single layer is preferable so that particles do not overlie. Placement is carried out so that the are density of particles is not less than $2\times10^6$ cm$^{-2}$ and not more than $2\times10^{10}$ cm$^{-2}$. The area density may be advantageously determined using a scanning electron microscope. The area density may be advantageously controlled by, for example, alteration of the slurry concentration, alteration of the coating amount or the spraying amount, or changing of wettability of the semiconductor multi-layer film and slurry by surface treatment of the semiconductor multi-layer film before placement. In the spin coat method, the area density can be controlled precisely by adjusting the slurry concentration. The surface treatment may be advantageously carried out by, for example, irradiation with UV light, plasma treatment, or cleaning with an acid or alkali chemical solution.

Figure 8:
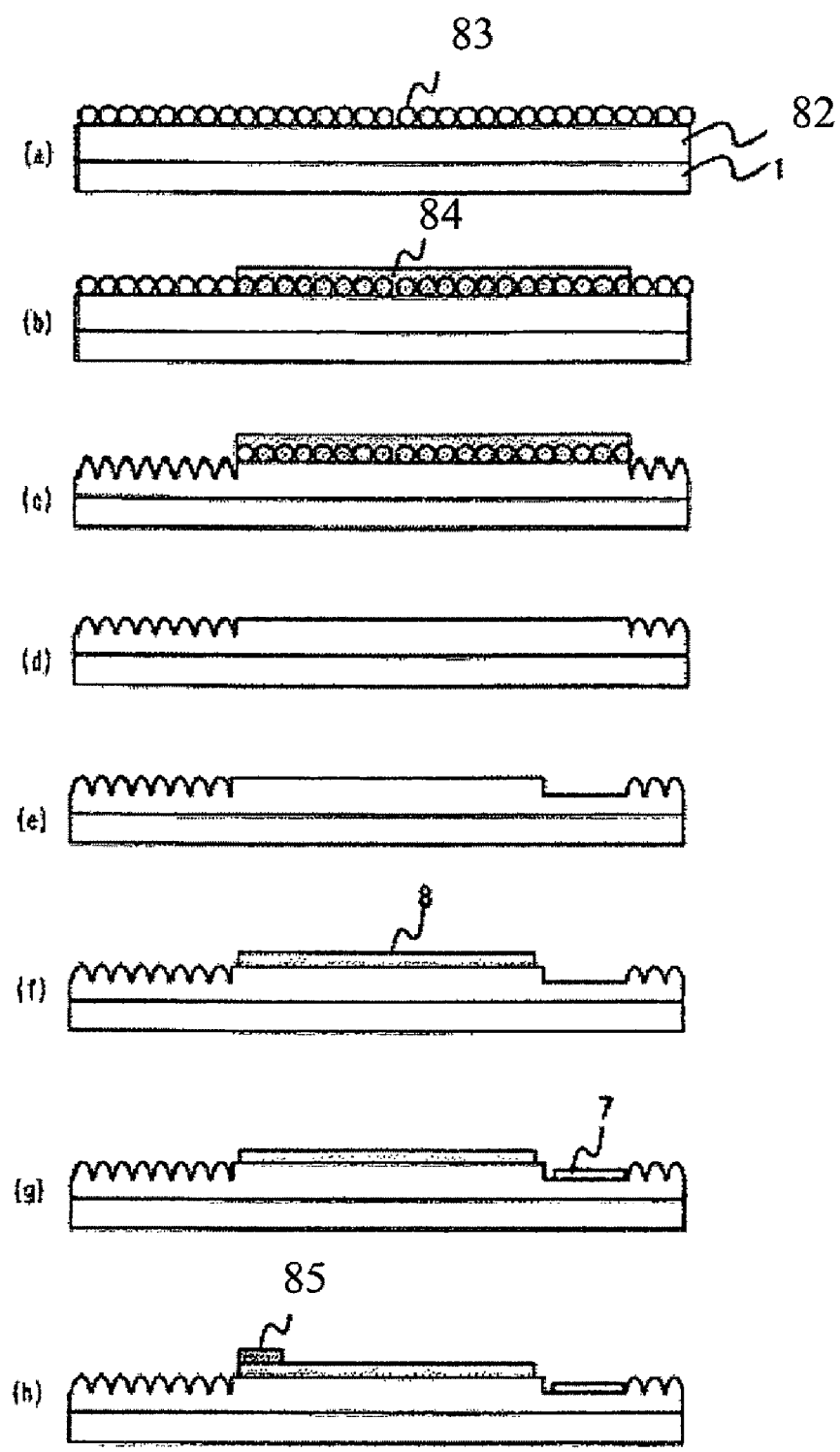
FIG. 8 shows an example of producing a group III nitride semiconductor light emitting device 1.

According to the step (I-2), particles 83 are placed on a semiconductor multi-layer film 82 grown on a substrate 1, as shown in FIG. 8 (*a*). In FIG. 8, details of the multi-layered structure of the semiconductor multi-layer film 82 are omitted.

Step (I-3) Formation of Convex

In the step (I-3), a semiconductor multi-layer film is dry-etched using particles as an etching mask, to form a convex, The dry etching may be advantageously carried out using, for example, an ECT dry etching apparatus or ICP dry etching apparatus. The dry etching is preferably carried out under a condition by which the maximum diameter of a particle in a direction parallel to a plane horizontal to a semiconductor multi-layer film (hereinafter, referred to as "lateral size of particle ($D_{MAX}$)") is reduced, while etching the semiconductor multi-layer film. It is preferable to carry out dry etching under a condition by which the lateral size of a particle ($D_{MAX}$) after dry etching is not more than 80%, further not more than 50% with respect to the particle size (diameter) of a particle before dry etching. By such dry etching, a convex is formed of which side wall surface is not vertical to but inclined to the surface of a semiconductor multi-layer film. Dry etching is preferably carried out under a condition to form a convex which, when the apex of the convex is divided by a cross-section vertical to a surface of taking out light, the outline of the cross-section contains at least two curved lines, and the curvature radius of the curved line situated at the bottom side of the convex is larger as compared with the curvature radius of the curved line situated at the apex side (for example, in the form of stalagmite).

Step (I-4) Formation of Electrode

In the step (I-4), a P electrode is formed on a semiconductor multi-layer film.

Formation of a P electrode may be advantageously carried out, for example, by a vacuum vapor deposition method or sputtering method, using the same material as that of the electrode of the above-described group III nitride semiconductor light emitting device 1 or a material which generates the same material.

Formation of a P electrode may be carried out before or after the dry etching (mesa shape processing) process, for exposing the N electrode formation surface. In this method, mesa shape processing is carried out after placement of particles and formation of a convex. By this, a plane obtained by connecting the apexes of convexes and an interface between the transparent P electrode 51 and the semiconductor multi-layer film 52 are usually in the same plane, as shown in FIG. 5 (*a*). A light emitting device obtained by using thus obtained semiconductor multi-layer film is suitable for high output. In contrast to the above-described process, if mesa shape processing is carried out before placement of particles and formation of a convex, a plane obtained by connecting the apexes of convexes and an interface between the transparent P electrode 51 and the semiconductor multi-layer film 52 are not in the same plane, as shown in FIG. 5 (*b*). A light emitting device is obtained even if thus obtained semiconductor multi-layer film is used. However, mesa shape processing is preferably carried out after placement of particles and formation of a convex, from the standpoint of reproducibility and controllability of the density of particles around mesa step portion.

In formation of a convex in the step (I-3), photo-resist patterning and etching may be combined. For example, when a p-type GaN-based semiconductor layer is dry-etched, resistivity increases due to etching damage, and a poor ohmic property is generated when an electrode is formed on the etched surface, in some cases. In such a case, particles are placed, then, a P electrode formation-planned region is protected with a photo-resist film 84 by a photolithography process, as shown in FIG. 8 (*b*). Dry etching for convex processing is performed, as shown in FIG. 8 (*c*). Next, when a photo-resist film is peeled and remaining particles under the photo-resist film are removed, as shown in FIG. 8 (*d*), a semiconductor layer at the electrode formation-planned region is not dry-etched. Removal of remaining particles may be advantageously carried out by wet etching or brush cleaning, and in the case of silica particles, the particles may be advantageously removed by etching with a hydrofluoric acid solution, for example. As shown in FIG. 8 (*e*), mesa shape formation is carried out for exposing an N-type semiconductor layer on the N-electrode formation-planned surface. By photolithography, regions other than the region to be etched are protected with a photo-resist film, and a semiconductor layer is etched, to expose the N-type semiconductor layer. Etching may be advantageously carried out by ICP dry etching, ECR dry etching and the like. Then, as shown in FIG. 8 (*f*), a P electrode 8 composed of a transparent electric conductive oxide is formed on a high concentration N-type semiconductor layer at the surface of taking out light. The P electrode 8 may be advantageously formed by vapor-depositing a transparent electric conductive oxide, effecting photo-resist patterning by a photolithography method, and performing dry etching or wet etching. As shown in FIG. 8 (*g*), an N electrode 7 is formed on the N-type semiconductor layer. The N electrode may be advantageously formed by, for example, effecting photo-resist patterning by a photolithography method, vapor-deposing an electrode metal by a vacuum vapor deposition method, sputtering method or the like, then, performing lift off.

Further, the formation may also be combined with a thermal treatment, for formation of ohmic contact between the N electrode and the N-type semiconductor layer. The thermal treatment varies depending on the kind of the electrode and the electron concentration of the N-type semiconductor layer, and for example, in the case of a Ti/Al electrode, annealing may be advantageously carried out under a nitrogen atmosphere at ~500° C. to 800° C. for 0.1 to 30 minutes. In the case of Al, V/Al, ITO electrodes, a thermal treatment is usually not necessary.

Then, as shown in FIG. 8 (*h*), a bonding pad electrode 85 is formed. The bonding pad electrode 85 may be advantageously formed by, for example, effecting photo-resist patterning by a photolithography method, vapor-depositing a pad electrode metal by a vacuum vapor deposition method, sputtering method or the like, then, performing lift off. The pad electrode metal is, for example, Ti, Au, Al, V, Pt or an alloy or compound containing these elements. The pad electrode 8 and the N electrode 7 may also be formed at the same time by a simultaneous process by using the same metal.

Group III Nitride Semiconductor Light Emitting Device 2

The group III nitride semiconductor light emitting device 2 of the present invention contains an N electrode, semiconductor multi-layer film and P electrode.

The N electrode has an effect of spreading current by the electrode and injecting current into the semiconductor layer, and an effect of suppressing absorption of lights and releasing the lights into the exterior. The N electrode is made of a transparent electric conductive oxide, preferably, of ITO, ZnO or $SnO_2$. The N electrode may be any of single layered or laminated. In the N electrode, it is preferable that the value of the product $\alpha \times d$ of the thickness (d) and the absorption coefficient ($\alpha$) is small, and for example, the value is preferably not more than 0.1, from the standpoint of further suppression of light absorption. Further, the P electrode manifests a sheet resistance of preferably not more than $50\Omega/\square$, from the standpoint of spreading current.

The semiconductor multi-layer film is made of a nitride compound of the formula $In_xGa_yAl_zN$ (wherein, x+y+z=1, $0 \leq x \leq 1$, $0 \leq y \leq 1$, $0 \leq z \leq 1$), and contains a high concentration N-type semiconductor layer, N-type semiconductor layer, light emitting layer and P-type semiconductor layer in this order.

The high concentration N-type semiconductor layer has an n-type impurity concentration of $5 \times 10^{18}$ cm$^{-3}$ to $5 \times 10^{20}$ cm$^{-3}$. The high concentration N-type semiconductor layer has a thickness of usually 1 nm to 5 μm, preferably 1 nm to 10 nm.

The N-type semiconductor layer is made of, for example, GaN and has an n-type impurity concentration of $1 \times 10^{18}$ cm$^{-3}$ to $5 \times 10^{18}$ cm$^{-3}$.

The light emitting layer may have any of a single quantum well structure and a multi quantum well structure.

The P-type semiconductor layer usually has a p-type impurity concentration of $1 \times 10^{18}$ cm$^{-3}$ to $5 \times 10^{20}$ cm$^{-3}$.

The P electrode is made of, for example, Ni, Au, Ti, Pt, Ag, Ru, or Rh. The P electrode may also be made of an alloy or compound containing at least one of these metals. Further, the P electrode may be any of single layered or laminated, and for example, may be a lamination of Ni/Au, or Ni/Pt/Au.

It is advantageous that the group III nitride semiconductor light emitting device 2 is usually processed into chips, and mounted on a package made of a metal, ceramics or resin.

Figure 9:
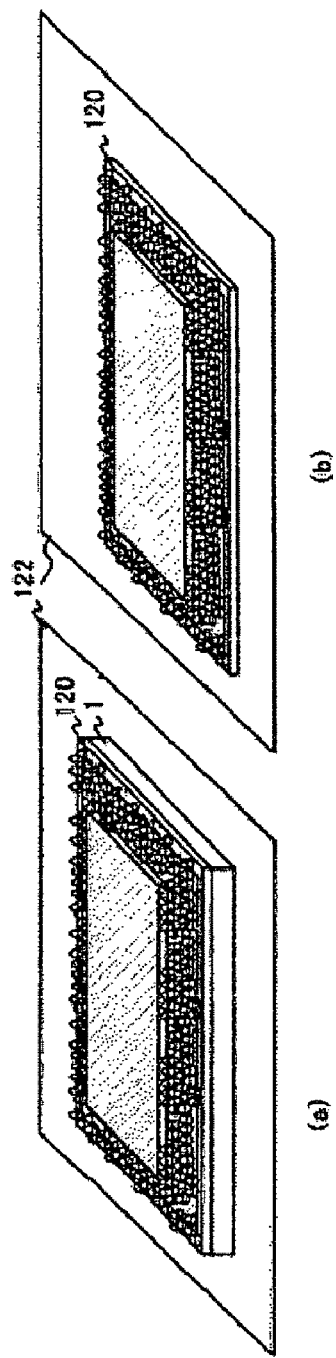
FIG. 9 shows a relation between a group III nitride semiconductor light emitting device 2 and a package.

In the group III nitride semiconductor light emitting device 2, a substrate 1 (for example, single crystal substrate) may be left for crystal growth of a semiconductor layer and a package 122 is joined to this as shown in FIG. 9 (*a*), alternatively, a substrate 1 may be removed and a package 122 is joined to a semiconductor layer 120 as shown in FIG. 9 (*b*). In FIG. 9 (*a*), FIG. 9 (*b*), a pad electrode, wiring to an electrode, and encapsulation resin are omitted.

In the group III nitride semiconductor light emitting device 2, it is preferable that the substrate 1 is removed as shown in FIG. 9 (*b*) from the standpoint of improvement of heat dissipation, in use of operation at high current density and the like.

Mounting to a package may be advantageously carried out, for example, by thermal compression bonding using Au or Cu, a method using a silver past, or a method using a soldering metal such as AuSn.

Figure 10:
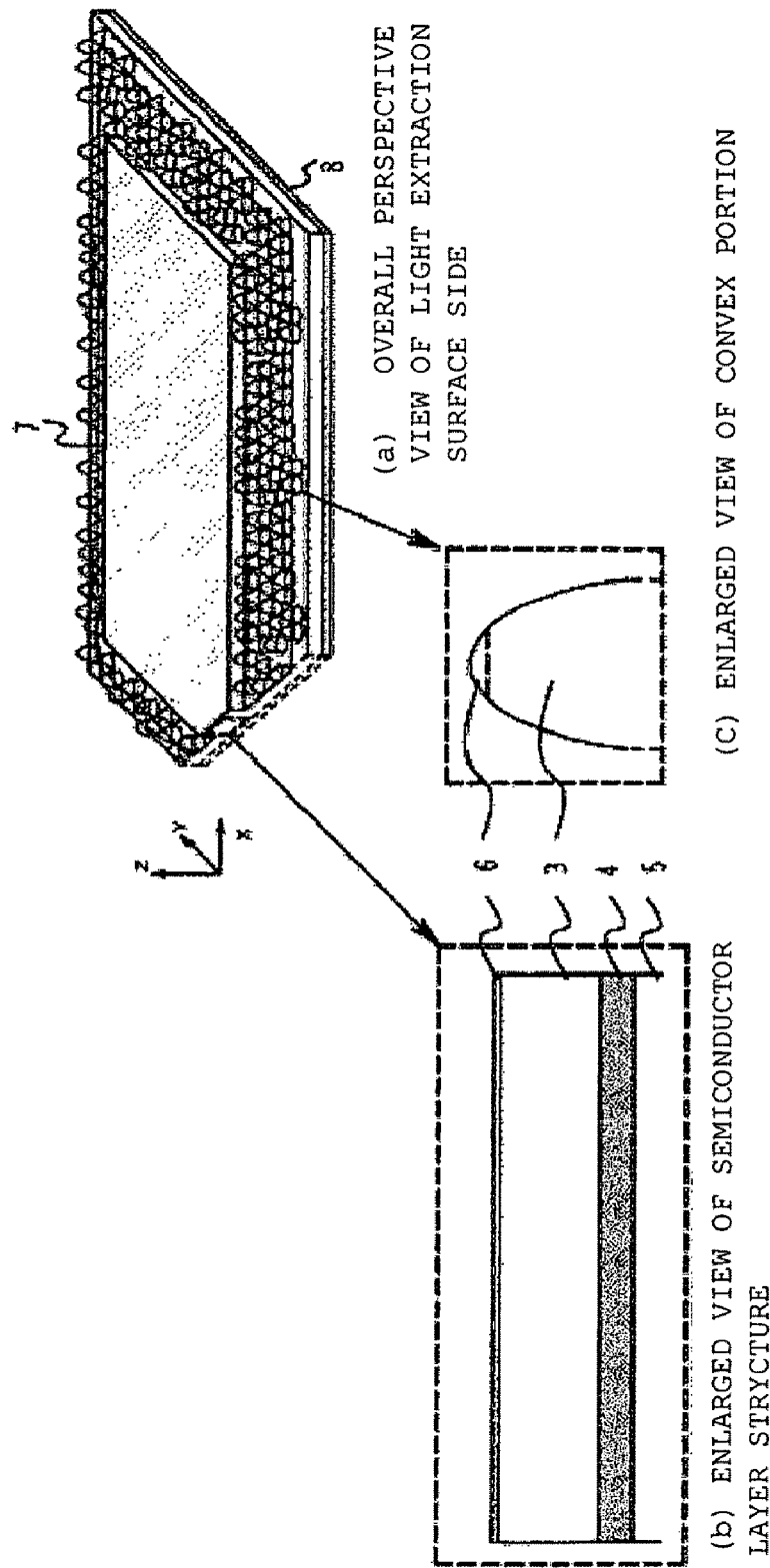
FIG. 10 is a perspective view of a group III nitride semiconductor light emitting device 2.

A typical structure of the group III nitride semiconductor light emitting device 2 will be illustrated by FIG. 10.

The group III nitride semiconductor light emitting device 2 has a multi-layered structure containing a P-type semiconductor layer 5, light emitting layer 4, N-type semiconductor layer 3 and high concentration N-type semiconductor extremely thin layer 6 in sequence, as shown in FIGS. 10 (*a*) and (*b*). The N electrode 7 is in contact with the high concentration N-type semiconductor extremely thin layer 6, and the P electrode 8 is in contact with the P-type semiconductor layer 5.

The group III nitride semiconductor light emitting device 2 has a convex composed of the N-type semiconductor layer 3 and the high concentration N-type semiconductor extremely thin layer 6, as shown in FIG. 10 (*a*).

Owing to the existence of the convex, the group III nitride semiconductor light emitting device 2 has an effect by which lights attenuating during repetition of multireflection while being confined in the group III nitride semiconductor light emitting device 2 are taken out from the convex into the exterior efficiently, or an effect by which lights are taken out into the exterior efficiently though the transparent N electrode 7 by changing the reflection angle.

There are usually at least two convexes, and preferably, the shapes and sizes thereof are identical, like the group III nitride semiconductor light emitting device 1. It is preferable that the convexes show an arrangement of non-periodic configuration.

The convex has an area density of usually $2 \times 10^6$ cm$^{-2}$ to $2 \times 10^{10}$ cm$^{-2}$.

It is preferable that the proportion of the surface areas of the convexes occupying with respect to the total surface area of the group III nitride semiconductor light emitting device 2 (hereinafter, referred to as area ratio) is not less than 2.3%.

Figure 11:
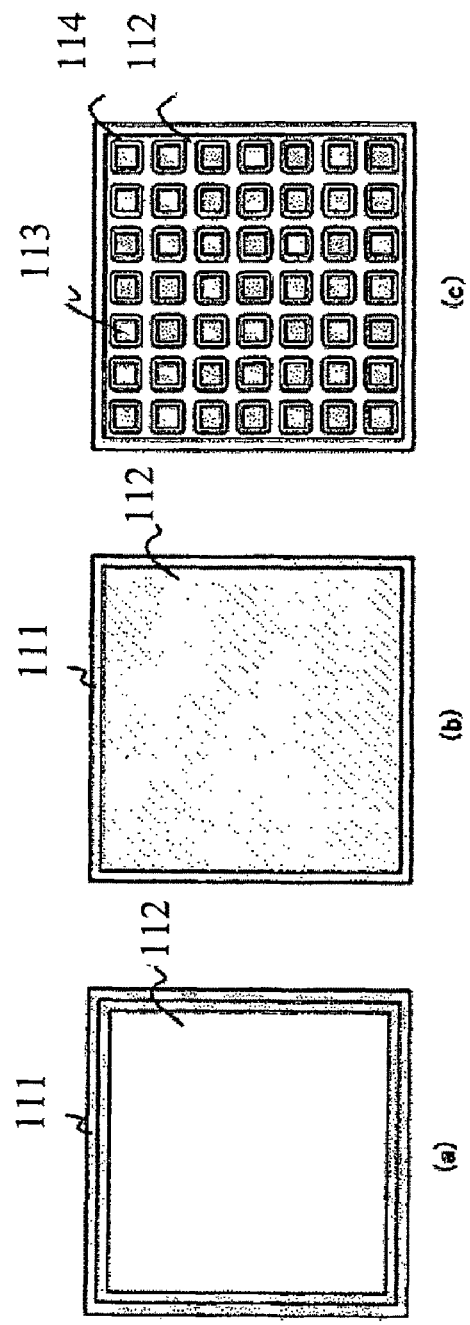
FIG. 11 shows various examples of convex formation regions.

The convex placement will be illustrated by FIG. 11. FIG. 11 is a figure viewed from the surface of taking out light of the group III nitride semiconductor light emitting device 2. With respect to the convex placement, a convex formation region 11 may be present around the group III nitride semiconductor light emitting device 2 as shown in FIG. 11 (*a*), may be present on the whole surface of the group III nitride semiconductor light emitting device 2 as shown in FIG. 11 (*b*), or may be present on an aperture 114 of the transparent electrode 112 as shown in FIG. 11 (*c*). Further, the convexes may also be placed by a combination thereof.

Method for Producing Group III Nitride Semiconductor Light Emitting Device 2

The group III nitride semiconductor light emitting device 2 of the present invention may be advantageously produced by a method containing, for example, the above-described steps (II-1) to (II-5).

Step (II-1) Growth of Semiconductor Multi-Layer Film

Figure 12:
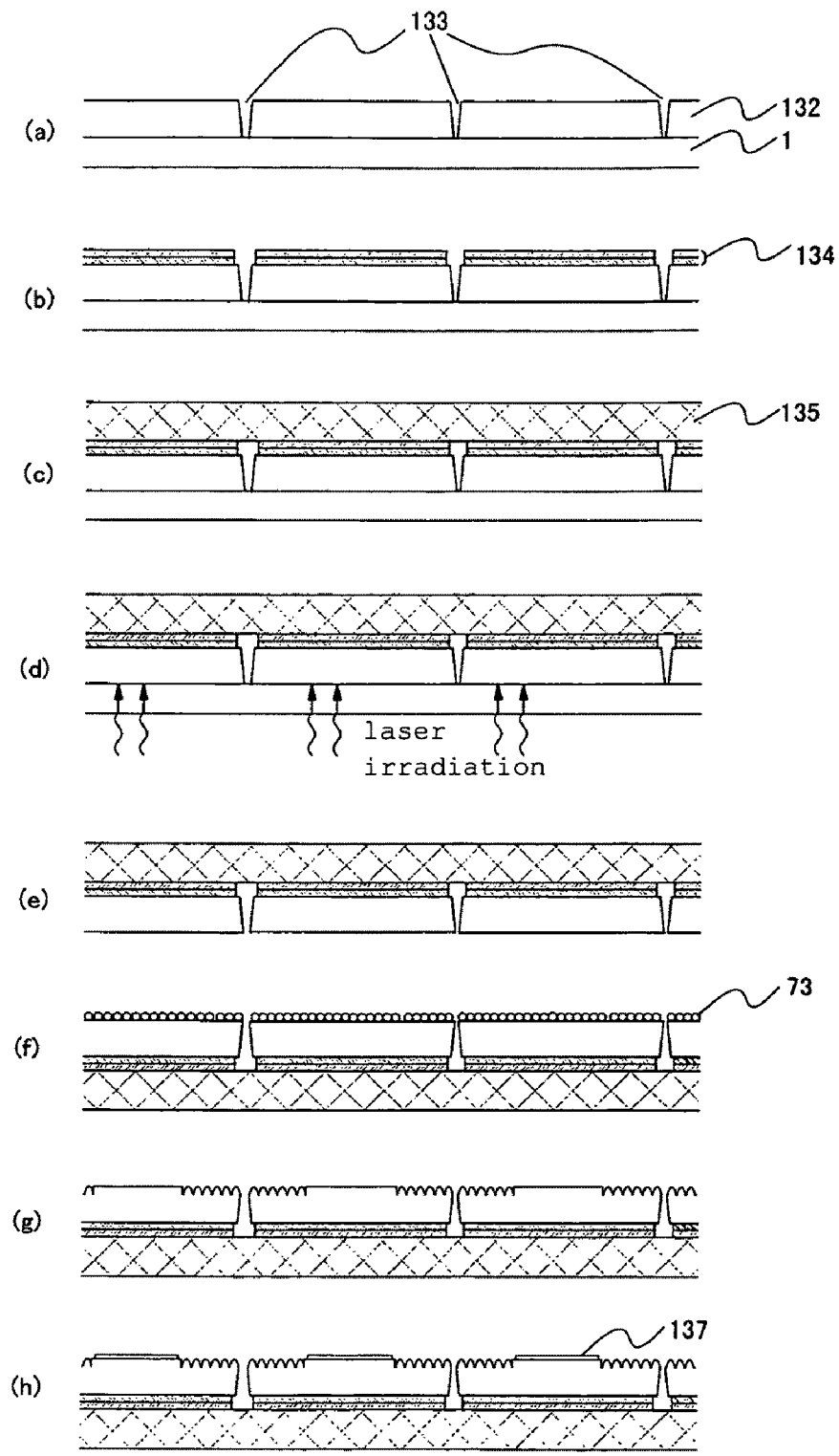
FIG. 12 shows an example of producing a group III nitride semiconductor light emitting device 2.

In the step (II-1), a high concentration N-type semiconductor layer having an n-type impurity concentration of $5 \times 10^{18}$ cm$^{-3}$ to $5 \times 10^{20}$ cm$^{-3}$, N-type semiconductor layer, light emitting layer and P-type semiconductor layer are allowed to grow on a substrate, and for example, a semiconductor multi-layer film 132 composed of a high concentration N-type semiconductor layer having an n-type impurity concentration of $5 \times 10^{18}$ cm$^{-3}$ to $5 \times 10^{20}$ cm$^{-3}$, N-type semiconductor layer, light emitting layer and P-type semiconductor layer is obtained, as shown in FIG. 12 (*a*). In the step (II-1), a low temperature buffer layer may also be formed, from the standpoint of making separation of the semiconductor multi-layer film and the substrate easy in the step (II-4). The low temperature buffer layer is formed on the substrate, and subsequently, the N-type semiconductor layer is formed thereon.

The substrate is, for example, a single crystal of SiC, Si, $MgAl_2O_4$, $LiTaO_3$, $ZrB_2$, $CrB_2$ or GaN, or sapphire, and preferably sapphire.

The low temperature buffer layer is made of, for example, InGaN or GaN, and has a thickness of usually 20 to 80 nm.

The N-type semiconductor layer, light emitting layer, P-type semiconductor layer and high concentration N-type semiconductor layer are as described in the case of the group III nitride semiconductor light emitting device 2 mentioned above.

Growth may be advantageously carried out according to the same method and conditions as for the production method of the group III nitride semiconductor light emitting device 1, and for example, may be advantageously carried out by MOVPE, HVPE or MBE.

In growth, it is preferable to form a semiconductor multi-layer film having a total thickness of not less than 20 μm and not more than 80 μm on a substrate, from the standpoint of reduction in the transference density of a semiconductor multi-layer film, prevention of crack generation and reduction in warping. It is further preferable to form a non-doped nitride semiconductor layer or a nitride semiconductor layer of low doping concentration having a thickness of not less than 20 μm on a substrate.

After growth, a separation ditch 133 reaching the substrate may also be formed by photolithography or dry etching on a semiconductor multi-layer film 132, as shown in FIG. 12 (*a*). Formation of the separation ditch may also be carried out by laser scribe. Further, the surface of the semiconductor multi-layer film 132 may also be washed.

Step (II-2) Formation of Electrode

In the step (II-2), a P electrode 134 is usually formed on the semiconductor multi-layer film 132, as shown in FIG. 12 (*b*).

Formation may be advantageously carried out, for example, by a vacuum vapor deposition method or sputtering method, using the same material as that of the P electrode of the above-described group III nitride semiconductor light emitting device 2 mentioned above or a material which generates the same material.

Step (II-3) Joining of Support

In the step (II-3), a support 125 is usually joined to a P electrode 134, as shown in FIG. 12 (*c*).

The support is electric conductive, and is, for example, a semiconductor such as Si, GaAs and SiC, or a metal such as Cu, Al, W, Mo, Hf, La, Ta, Ir, Ru, Os and Nb. Of them, metal materials having a thermal expansion coefficient of not more than $1.5 \times 10^{-6}/°$ C. are preferable, and Mo is further preferable. The support usually has an average surface roughness by sensing contact stylus surface roughness measuring apparatus of not more than 5 nm, and a thickness of 20 to 200 μm from the standpoint of reducing warping.

Joining may be advantageously carried out, for example, by thermal compression bonding using Au or Cu, or joining using a soldering metal such as AuSn.

Step (II-4) Separation of Substrate

In the step (II-4), a substrate is separated from a semiconductor multi-layer film.

Separation may be advantageously carried out using, for example, laser, and when the substrate 1 is sapphire and the semiconductor multi-layer film 132 is GaN, laser light is emitted from the side of the substrate 1 as shown in FIG. 12 (*d*). When the laser light has a third harmonic wave of $YVO_4$ laser (wavelength: 355 nm), the substrate 1 does not absorb laser light effectively, and the semiconductor multi-layer film 132 absorbs light. Of the semiconductor multi-layer film 132, a region which absorbed laser light causes decomposition, to deposit a group III material (Ga) and nitrogen. As shown in FIG. 12 (*e*), by placing the semiconductor multi-layer film 132 under an atmosphere of not lower than the melting point (30° C.) of Ga, the substrate 1 can be separated. Laser light is preferable from the standpoint of efficient absorption of energy so as to cause decomposition of the semiconductor multi-layer film 132. Shorter light wavelength is preferable. For example, since light having an energy larger than the band gap shows significant absorption, light having a wavelength shorter than 365 nm is recommendable when the semiconductor multi-layer film 132 is GaN, and in the case of laser, excimers such as third harmonic wave (wavelength: 355 nm) or fourth harmonic wave (wavelength: 266 nm) of YAG and $YVO_4$, ArF (wavelength: 193 nm), KrF (wavelength: 193 nm) and XeCl (wavelength: 308 nm) are mentioned. The laser light oscillation mode is, for example, continuous oscillation, normal pulse oscillation or Q switch pulse oscillation. From the standpoint of decreasing thermal influence, Q switch pulse oscillation is preferable, and of Q switch pulse oscillation, CW excitation Q switch pulse oscillation having a short pulse of ns order and high peak power is preferable. Light may be advantageously supplied, in the mode of spot, line and area, to regions around an interface of the substrate 1 and the semiconductor multi-layer film 132. From the standpoint of efficient separation, it may also be permissible that laser light in the form of spot or line is used, the laser light is introduced from the substrate 1, and the focus of the laser light is shifted (defocus) from an interface of the substrate 1 and the semiconductor multi-layer film 132 to the side of the semiconductor multi-layer film 132. Since the energy of laser light has spatial distribution, it may also be permissible that a wafer (for example, 2 inch diameter) is controlled to cause overlap of irradiation regions and energy is transmitted uniformly to the interface, for uniform in-plane separation of the substrate 1

Separation may also be carried out by a method of placing inorganic particles on a substrate. Inorganic particles used for separation of a substrate are placed before formation of a semiconductor multi-layer film.

The inorganic material is composed of, for example, an oxide, nitride, carbide, boride, sulfide, selenide or metal. The oxide is silica, alumina, zirconia, titania, ceria, magnesia, zinc oxide, tin oxide, or yttrium aluminum garnet (YAG). The nitride is silicon nitride, aluminum nitride, or boron nitride. The carbide is SiC, boron carbide, diamond, graphite, or fullerene. The boride is $ZrB_2$, or $CrB_2$. The sulfide is zinc sulfide, calcium sulfide or strontium sulfide. The selenide is zinc selenide, or cadmium selenide. These may include partial substitution of constituent elements with other element, and for example, SiAlON containing silicon, aluminum, oxygen and nitrogen may also be permissible. The metal is Si, Ni, W, Ta, Cr, Ti, Mg, Ca, Al, Au, Ag, or Zn. These may be used singly or in combination. The inorganic material may be a nitride covered with an oxide, or a phosphor obtained by introducing an activator such as cerium and europium into an organic material. The inorganic material is preferably an oxide, further preferably silica.

As the inorganic particle, those of any shape such as sphere, plate, needle, indeterminate form and the like can be used, and among them, sphere is preferable because of no orientation. Thus, spherical silica is more preferable as the inorganic particle. As the spherical silica, silica particles contained in a colloidal silica slurry are more preferably used from the standpoint of easy availability of those showing single dispersion and having relatively uniform particle sizes.

The colloidal silica slurry is prepared by dispersing silica fine particles, in the form of colloid, in a solvent such as water and the like, and obtained by ion exchange of sodium silicate, or hydrolysis of an organic silicon compound such as tetraethyl orthosilicate (TEOS), and spherical silica particles tend to be obtained.

The inorganic particles have an average particle size of usually 5 nm to 50 μm, preferably 10 nm to 10 μm, further preferably 20 nm to 1 μm. When the average particle size is not less than 5 nm, inorganic particles scarcely overlie in two or more layers in a process of placing inorganic particles on a substrate, and in the subsequent growth of a semiconductor multi-layer film embedding inorganic particles, it becomes easy to embed inorganic particles to attain flat growth. When the average particle size is not more than 50 μm, it becomes easier to embed inorganic particles to attain flat growth in a process of growing a semiconductor multi-layer film embedding inorganic particles, and in a separation process of separating a semiconductor multi-layer film and a substrate, separation becomes easy. Two or more inorganic particles of different particle sizes may also be mixed providing the average particle size when two or more inorganic particles of different particle sizes are mixed is in the above-described range.

Placement may be advantageously carried out by a method in which a slurry prepared by dispersing inorganic particles in a solvent is used, and a substrate is immersed in the slurry, or the slurry is coated or sprayed on a substrate, then, dried. Examples of the solvent include water, methanol, ethanol, isopropanol, n-butanol, ethylene glycol, dimethylacetamide, methyl ethyl ketone and methyl isobutyl ketone, and water is preferable from the standpoint of handling and easy availability. The drying may also be carried out using a spinner.

The coverage of inorganic particles with respect to a substrate is defined by the following formula using the particle number P counted in the measuring visual field (area S) in observing the surface of a substrate carrying placed inorganic particles from the upper side by a scanning electron microscope (SEM), and the average particle size d of the particles.

Coverage (%)=$((d/2)^2 \times \pi \cdot P \cdot 100)/S$

Though this coverage is not particularly restricted, it is preferably 1% to 95%, more preferably 30% to 95%, further preferably 50% to 95%. When not less than 1%, there is a tendency of easier peeling of a group III-V nitride semiconductor layer from a substrate, and when not more than 95%, there is a preferable tendency that the effective surface area of a substrate increases more and epitaxial growth of a semiconductor multi-layer film becomes easier. It is desired that inorganic particles placed on a substrate manifest a single layer structure, that is, a single particle structure. Inorganic particles may partially overlie in two or more layers, however, in this case, epitaxial growth of a semiconductor multi-layer film becomes difficult, leading to difficult embedding in flat form, in some cases. A cross-sectional view of a structure formed by thus placing inorganic particles 12 on the surface of a substrate 13 is shown in FIG. 13 (a).

Figure 13:
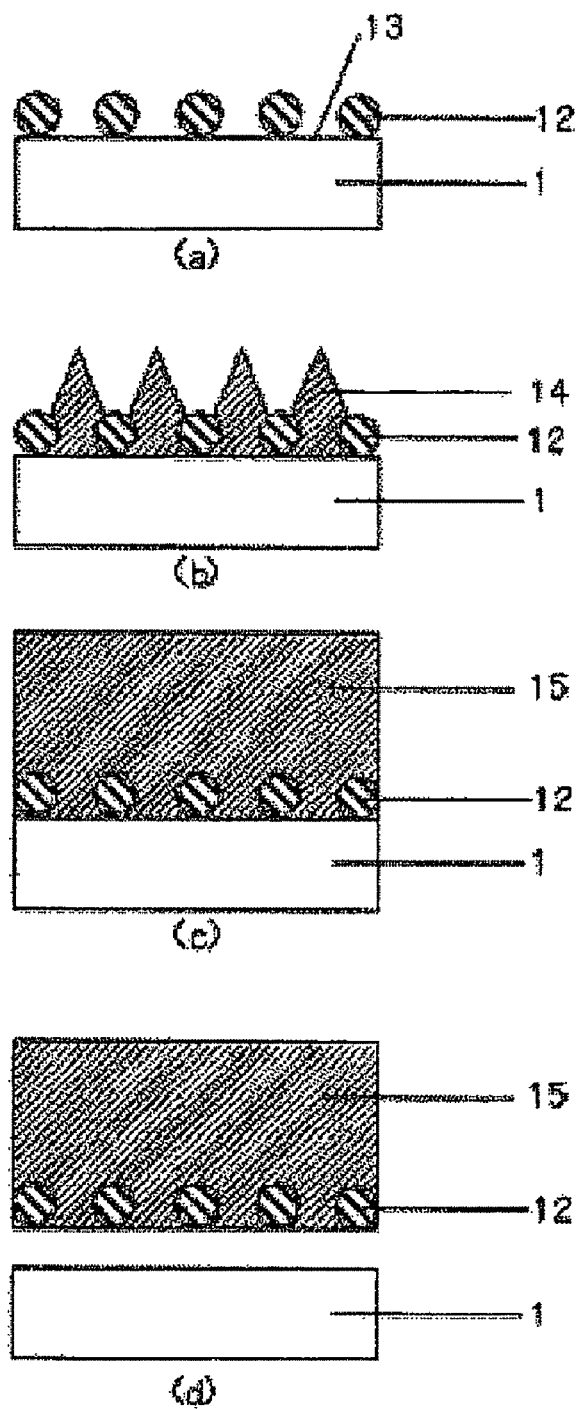
FIG. 13 shows another example of producing a group III nitride semiconductor light emitting device 2.

In the case of separation of a substrate using inorganic particles, inorganic particles 12 are placed on a substrate 11, and a semiconductor multi-layer film 15 is formed on the substrate so as to embed the inorganic particles 12, then, the semiconductor multi-layer film 15 and the substrate 11 are separated, as shown in FIG. 13 (a).

Separation of the semiconductor multi-layer film 15 and the substrate 11 may be advantageously carried out, for example, by a method of applying stress to mechanically peel the substrate 11, and may be advantageously carried out by a method of applying internal stress and/or external stress on an interface of the semiconductor multi-layer film and the substrate. The separation using internal stress may be advantageously carried out by a method in which after growth of a semiconductor multi-layer film, a substrate is naturally peeled utilizing stress based on difference in thermal expansion coefficient of the semiconductor multi-layer film and the substrate, and for example, may be advantageously carried out by a method of cooling from the growth temperature of a semiconductor multi-layer film to room temperature, cooling from room temperature to lower temperature using a medium (liquid nitrogen and the like), heating once from room temperature, then, cooling to lower temperature using a medium (liquid nitrogen and the like). The separation using external stress may be advantageously carried out by a method in which either a semiconductor multi-layer film or a substrate is fixed, and impact is applied to another body. For promoting peeling of a semiconductor multi-layer film and a substrate, the above-described separation using laser light may also be combined. The separation using inorganic particles is capable of reducing damage on a semiconductor multi-layer film in separating, and capable of providing peeling of a substrate without lowering the light emission property of the semiconductor multi-layer film.

By separating a substrate by the method using laser light and the method using inorganic particles, a semiconductor multi-layer film 110 and a package come into contact, to improve the heat releasing property of the device as shown in FIG. 5 (b), for example. Since the device is excellent in heat dissipation, light emission efficiency does not lower even in the case of operation at high current density.

Step (II-5) Placement of Particles

In the step (II-5), particles having an average particle size of 0.01 μm to 10 μm are placed at an area density of $2 \times 10^6$ cm$^{-2}$ to $2 \times 10^{10}$ cm$^{-2}$ on a high concentration N-type semiconductor layer of a semiconductor multi-layer film, and for example, as shown in FIG. 12 (f), particles 73 acting as a dry etching mask are placed on a semiconductor layer 132. In placing, it is preferable to perform a chemical treatment such as wet etching or a physical treatment such as grinding and polishing on the surface in contact with the substrate 1 of the semiconductor multi-layer film, and by such a treatment, the surface in contact with the substrate 1 of the semiconductor multi-layer film gets improved flatness.

Step (II-6) Formation of Convex

In the step (II-6), a semiconductor multi-layer film is dry-etched using particles as an etching mask, to form a convex. The step (II-5) may be advantageously carried out according to the same method and conditions as for the step (I-3), and FIG. 12 (g) shows a cross-sectional view of a device after convex formation.

Step (II-7) Formation of Electrode

In the step (II-7), an N electrode is formed on a high concentration N-type semiconductor layer, and for example, as shown in FIG. 12 (h), an N electrode 137 made of a transparent electric conductive oxide is formed on a high concentration N-type semiconductor layer 132.

Formation may be advantageously carried out, for example, by a method of vapor-depositing the same material as that of the N electrode of the above-described group III nitride semiconductor light emitting device 2 or a material which generates the same material, effecting photo-resist patterning by a photolithography method, and performing dry etching or wet etching.

EXAMPLES

Examples of the present invention will be illustrated, but the present invention is not limited to them.

Example 1

A semiconductor multi-layer film having a structure shown in FIG. 6 (a) was produced. On a sapphire substrate 1, a GaN buffer layer 2 having a thickness of 50 nm was grown at a growth temperature of 530° C. On the GaN buffer layer 2, an n-type GaN layer (N-type semiconductor layer 3) having a thickness of 4 μm and an n-type carrier concentration of $2\times10^{18}$ cm$^{-3}$ was grown at a growth temperature of 1110° C. using disilane as a dopant gas. On the n-type GaN layer 3, an n-type GaN layer (not shown) having a thickness of 100 nm and an n-type carrier concentration of $5\times10^{17}$ cm$^{-3}$ was grown at a growth temperature of 1120° C. On this n-type GaN layer, a light emitting layer 4 was grown. The light emitting layer 4 had a multi quantum well structure composed of five well layers, containing GaN having a thickness of 15 nm as the barrier layer and a $In_{0.12}Ga_{0.88}N$ layer having a thickness of 3 nm as the well layer. On the light emitting layer 4, a magnesium-doped AlGaN layer (not shown) having a thickness of 30 nm was grown at a growth temperature of 940° C. using biscyclopentadiethyl magnesium [$(C_5H_5)_2Mg$] as a magnesium source. On the AlGaN layer, a p-type GaN layer 5 (P-type semiconductor layer) having a thickness of 200 nm was grown at a growth temperature of 1010° C. using biscyclopentadiethyl magnesium as a p-type dopant source. On the p-type GaN layer 5, a silicon high concentration-doped InGaN layer 6 (high concentration N-type semiconductor layer) having a thickness of 5 nm was grown at a growth temperature of 700° C. The p-type GaN was annealed at 700° C. for 20 minutes under a nitrogen atmosphere for carrier activation.

Then, the surface of the InGaN layer 6 was treated with a mixed solution of sulfuric acid and hydrogen peroxide water, then, on the InGaN layer 6, a colloidal silica slurry (Fuso Chemical Co., Ltd., "PL-20", average particle size: 370 nm) was coated by a spin coat method, and dried to attain placement of silica particles. The average particle size was measured by a photography by a scanning electron microscope (hereinafter, referred to as SEM). The InGaN layer 6 after placement was observed by SEM. The silica particles had a particle density of 8 to $10\times10^8$ cm$^{-2}$, and showed very uniform density distribution in the plane of a sample of 20 mm□ size.

Figure 14:
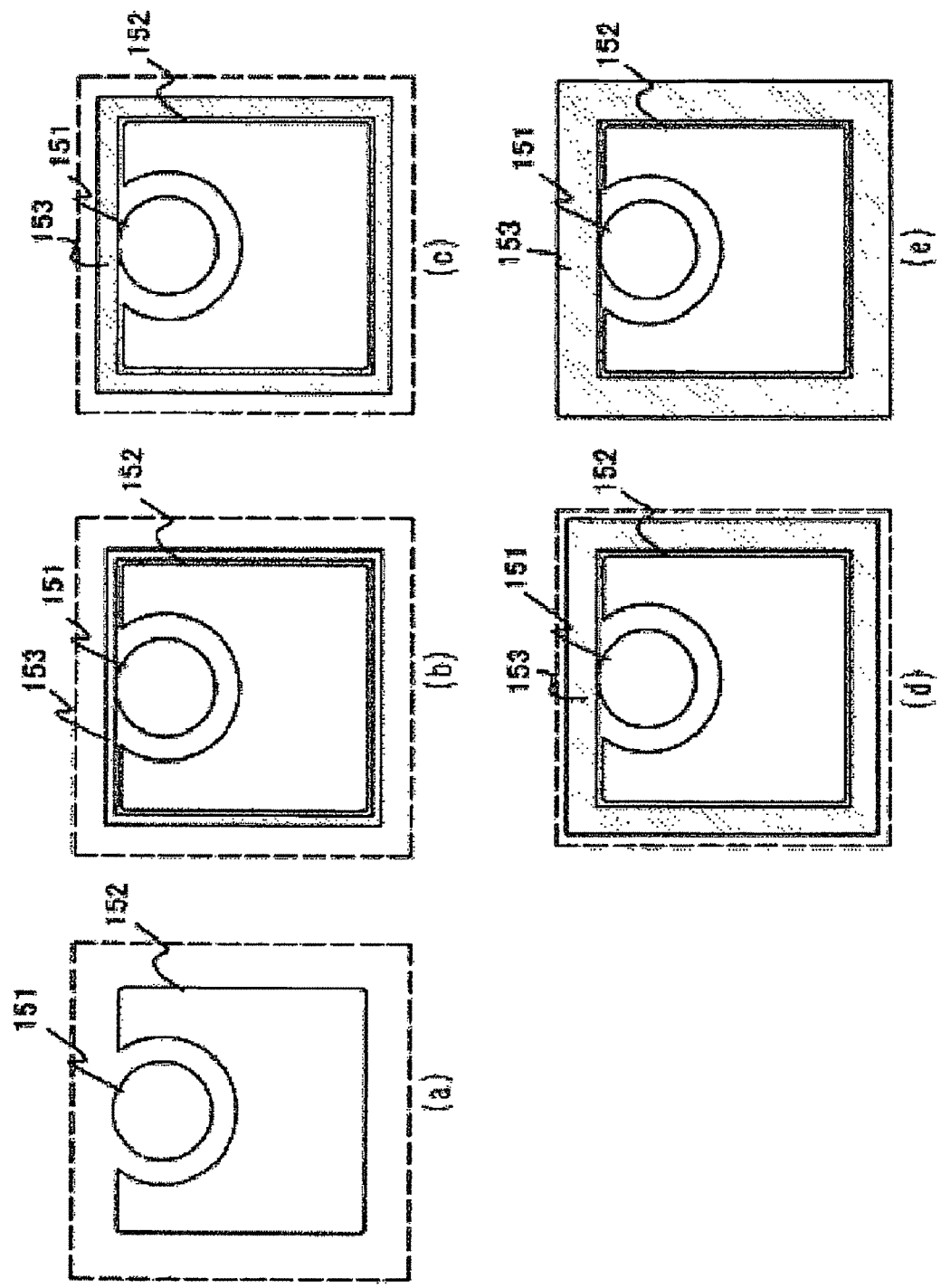
FIG. 14 shows group III nitride semiconductor light emitting devices of Examples 1 to 4 and Comparative Example.

Photo-resist covering parts and non-covering parts were formed by photolithography, to protect regions other than diagonal line parts shown in FIG. 14 (e) with the photo-resist. By this, an N electrode formation-planned region 151 and a P electrode formation-planned region 152 were protected from damage by dry etching, and a convex formation region 153 corresponded to the diagonal line region in the figure.

Figure 15:
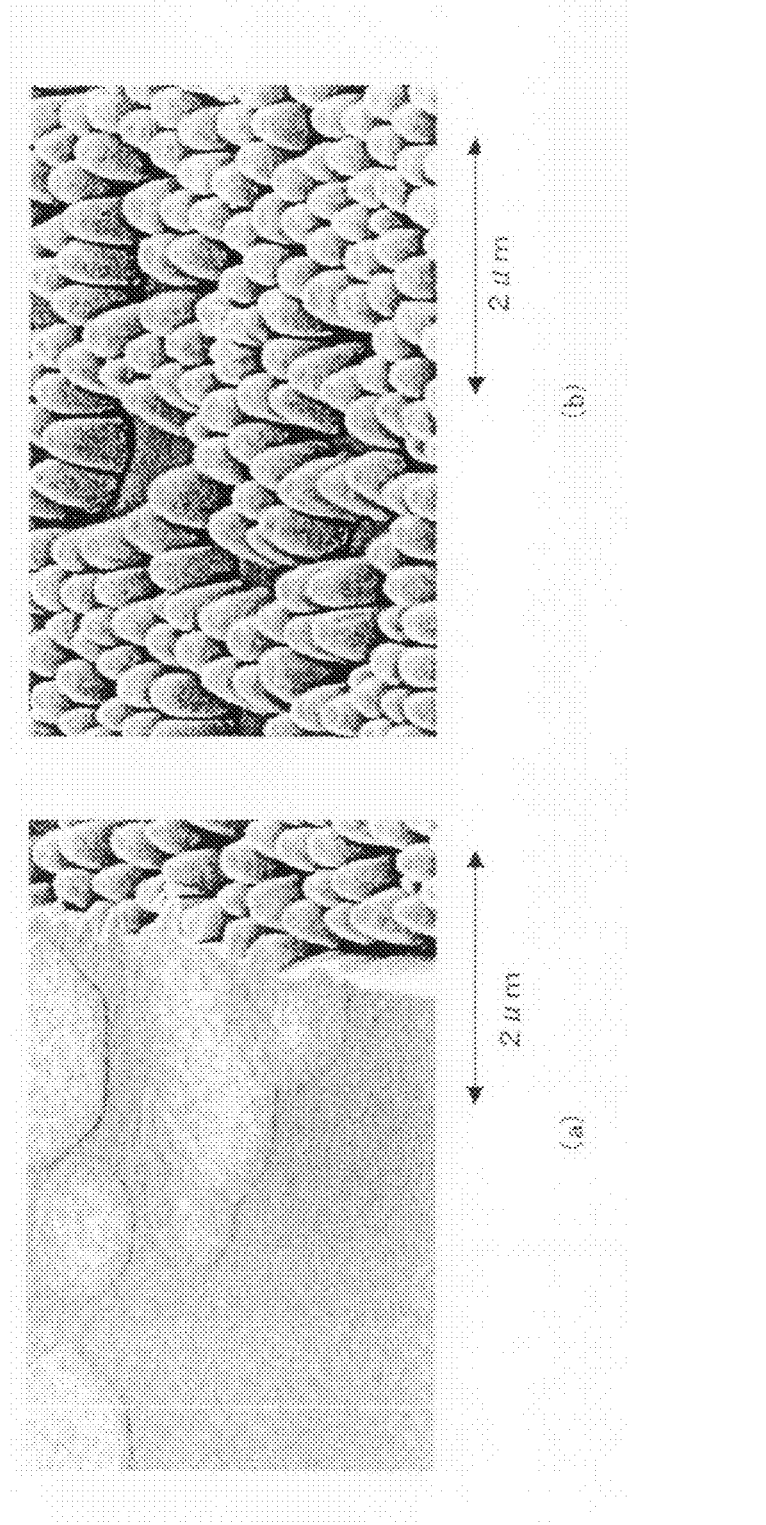
FIG. 15 shows the convex formation region and a boundary of the convex formation region and non-formation region, of a group III nitride semiconductor light emitting device of Example 1.

In an ICP dry etching apparatus, the semiconductor multi-layer film was etched under conditions of a substrate bias power of 100 W, an ICP power of 200 W, a pressure of 0.8 Pa, a chlorine gas amount of 20 sccm, a dichloromethane amount of 10 sccm, an argon amount of 40 sccm and a treatment time of 6.5 minutes using silica particles as a mask, to form convexes. GaN was etched with a depth of 0.6 μm in the direction vertical to the substrate surface, and the lateral size of the silica particle decreased to 0.18 μm on average. The lateral size of the silica particle after dry etching reached about 50% of the diameter before dry etching of the particles. GaN directly below the silica particles was processed into a shape of fine stalagmite. The fine stalagmite shape had a diameter of the bottom of 0.4 μm, being approximately the same as the diameter of the colloidal silica before dry etching. After the dry etching treatment, the photo-resist was peeled, and the remaining silica particles were removed by wet etching using buffered hydrofluoric acid. FIG. 15 (a) shows an SEM image of the surface of the semiconductor at the boundary of the convex formation region and non-formation region. FIG. 15 (b) shows an SEM image of the convex formation region.

The high concentration N-type semiconductor layer was washed by immersing in a mixed solution of sulfuric acid and hydrogen peroxide water for 2 minutes, then, an ITO film having a thickness of 140 nm was formed by a vacuum vapor deposition method. Photo-resist patterning was carried out by a photolithography method, and the ITO film was etched with a 1:1 mixed solution of an aqueous ferric chloride solution and a hydrochloric acid solution to attain pattern formation, then, the photo-resist was peeled, to form an ITO electrode on the region 152 as shown in FIG. 14 (e).

Exposed regions of the N-type semiconductor layer were patterned by a photolithography method. The semiconductor multi-layer film was etched with a depth of 1 μm by ICP dry etching, to expose an n-type semiconductor layer 3, and the photo-resist was peeled, to form a mesa shape.

The n-type semiconductor layer 3 was subjected to photo-resist patterning in the n electrode region by a photolithography method, and V/Al (thickness 10 nm/100 nm) metal was vapor-deposited by a vacuum vapor deposition method, then, an n electrode 7 was formed by photo-resist lift off.

On the ITO electrode, photo-resist patterning was performed in the pad electrode region by a photolithography method, and Ti/Au (thickness 50 nm/200 nm) metal was vapor-deposited by a vacuum vapor deposition method, then, a pad electrode was formed by photo-resist lift off, to obtain a light emitting device. In the light emitting device, the proportion of the surface areas of the convexes occupying with respect to the total surface area was 17.7%. In FIG. 14 (a) to (e), the pad electrode was omitted.

Figure 16:
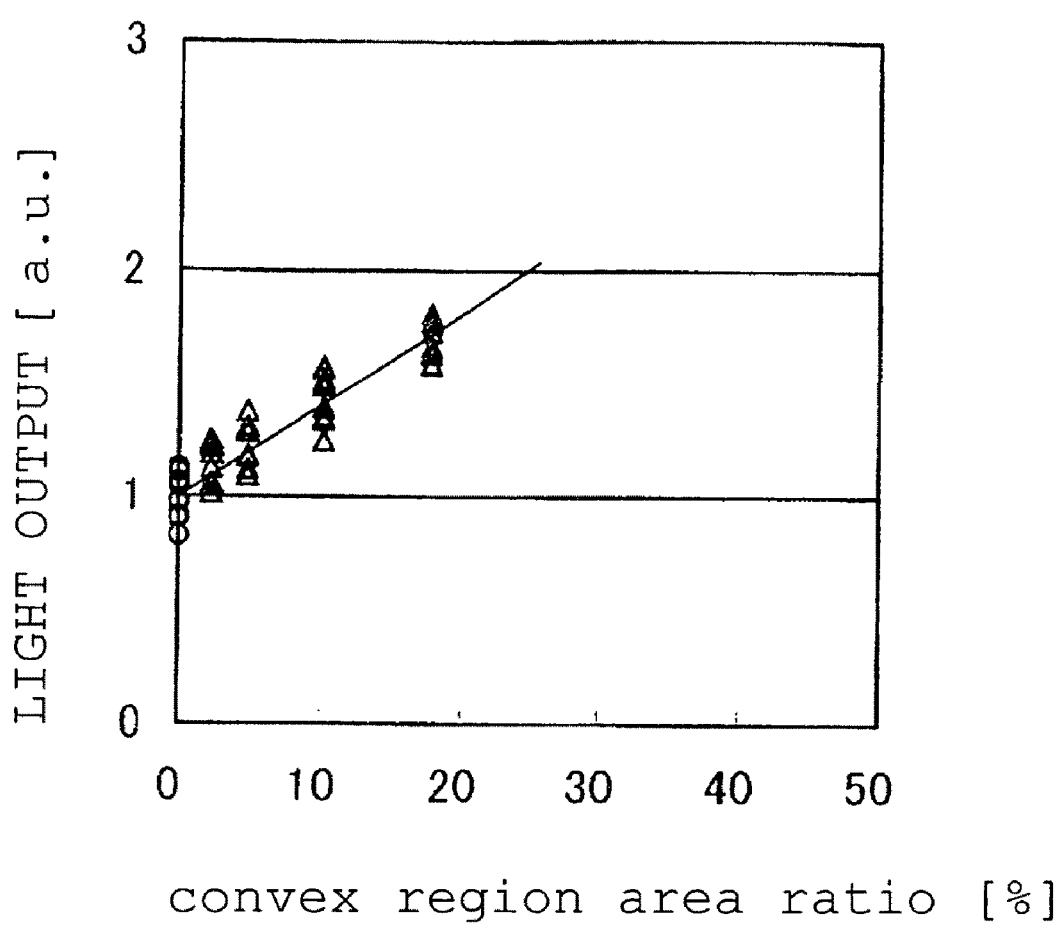
FIG. 16 shows relations between the convex region area ratio and light output, of group III nitride semiconductor light emitting devices of Examples 1 to 4 and Comparative Example.

The light emitting device was processed into a chip shape of 420 μm×420 μm×90 μm, and evaluated. For ten light emitting devices, a current of 20 mA was allowed to flow between both electrodes in the existence of the sapphire substrate, and light output was measured. The results are shown in Table 1 and FIG. 16. The light output was measured with a photo diode fixed directly above the chip.

Example 2

A light emitting device was obtained in the same operation as in Example 1 excepting that the convex formation region was a diagonal line region in FIG. 14 (d). In the light emitting device, the proportion of the surface area of the convex region occupying with respect to the total surface area was 10.1%. The light output was measured under the same conditions as in Example 1. The results are shown in Table 1 and FIG. 16.

Example 3

A light emitting device was obtained in the same operation as in Example 1 excepting that the convex formation region was a diagonal line region in FIG. 14 (c). In the light emitting device, the proportion of the surface area of the convex region occupying with respect to the total surface area was 4.8%. The light output was measured under the same conditions as in Example 1. The results are shown in Table 1 and FIG. 16.

Example 4

A light emitting device was obtained in the same operation as in Example 1 excepting that the convex formation region was a diagonal line region in FIG. 14 (b). In the light emitting device, the proportion of the surface area of the convex region occupying with respect to the total surface area was 2.3%. The light output was measured under the same conditions as in Example 1. The results are shown in Table 1 and FIG. 16.

Comparative Example 1

A light emitting device shown in FIG. 14 (a) was obtained in the same operation as in Example 1 excepting that placement of silica particles and processing of fine stalagmite shape were not carried out. The light output was measured under the same conditions as in Example 1. The results are shown in Table 1 and FIG. 16.

TABLE 1

Convex area ratio and light output of light emitting device

|  | Convex area ratio (%) | light output (a.u.) |
|---|---|---|
| Example 1 | 17.7 | 1.63 |
| Example 2 | 10.1 | 1.57 |
| Example 3 | 4.8 | 1.33 |
| Example 4 | 2.3 | 1.10 |
| Comparative Example 1 | — | 100 |

*1 The light output value is shown while hypothesizing the light output of the light emitting device of Comparative Example 1 being 1.00.

INDUSTRIAL APPLICABILITY

The group III nitride semiconductor light emitting device of the present invention shows high light extraction efficiency. According to the group III nitride semiconductor light emitting device of the present invention, an efficient method for producing a group III nitride semiconductor light emitting device showing high light extraction efficiency is provided.

The invention claimed is:

1. A group III nitride semiconductor light emitting device comprising (a1), (b1) and (c1) in this order:
   (a1) an N electrode,
   (b1) a semiconductor multi-layer film,
   (c1) a transparent electric conductive oxide P electrode,
   wherein the semiconductor multi-layer film comprises an N-type semiconductor layer, light emitting layer, P-type semiconductor layer and high concentration N-type semiconductor layer having an n-type impurity concentration of $5\times10^{18}$ cm$^{-3}$ to $5\times10^{20}$ cm$^{-3}$ in this order, the N-type semiconductor layer is in contact with the N electrode, and the semiconductor multi layer film has at least two convex shapes and the shapes and sizes thereof are identical, and
   wherein a plane obtained by connecting the apexes of the convex shapes and an interface between the transparent electric conductive oxide P electrode and the semiconductor multi-layer film are in the same plane.

2. A method for producing a surface light emitting type semiconductor light emitting device comprising the steps (I-1) to (I-4):
   step (I-1): an N-type semiconductor layer, light emitting layer, P-type semiconductor layer and high concentration N-type semiconductor layer having an n-type impurity concentration of $5\times10^{18}$ cm$^{-3}$ to $5\times10^{20}$ cm$^{-3}$ are allowed to grow on a substrate to obtain a semiconductor multi-layer film,
   step (I-2): particles having an average particle size of 0.01 μm to 10 μm are placed at an area density of $2\times10^6$ cm$^{-2}$ to $2\times10^{10}$ cm$^{-2}$ on the high concentration N-type semiconductor layer of the semiconductor multi-layer film,
   step (I-3): the semiconductor multi-layer film is dry-etched using the particles as an etching mask, to form a convex shape,
   step (I-4): a P electrode is formed on the semiconductor multi-layer film.

3. The method according to claim 2, wherein the particles used in the step (I-2) are made of an inorganic material.

4. The method according to claim 3, wherein the inorganic material is selected from the group consisting of oxides, nitrides, carbides, borides, sulfides, selenides and metals.

5. The method according to claim 4, wherein the inorganic material is an oxide.

6. The method according to claim 5, wherein the oxide is silica.

7. A group III nitride semiconductor light emitting device comprising (a2), (b2) and (c2):
   (a2) a transparent electric conductive oxide N electrode,
   (b2) a semiconductor multi-layer film,
   (c2) a P electrode,
   wherein the semiconductor multi-layer film comprises a high concentration N-type semiconductor layer having an n-type impurity concentration of $5\times10^{18}$ cm$^{-3}$ to $5\times10^{20}$ cm$^{-3}$, N-type semiconductor layer, light emitting layer and P-type semiconductor layer in this order, the P-type semiconductor layer is in contact with the P electrode, and the semiconductor multilayer film has a convex shape.

8. The device according to claim 7, wherein there are at least two convex shapes and the shapes and sizes thereof are identical.

9. The device according to claim 7, wherein the convex shapes show an arrangement of non-periodic configuration.

10. The device according to claim 7, wherein in the convex shape, a cross-section parallel to the semiconductor multi-layer film is circular, a cross-section vertical to the semiconductor multi-layer film contains a curved line and the curvature radius thereof increases monotonously from the apex toward peripheral parts.

11. The device according to claim 7, wherein the convex shape has an area density of $2\times10^6$ cm$^{-2}$ to $2\times10^{10}$ cm$^{-2}$.

12. The device according to claim 7, wherein the proportion of the surface areas of the convex shapes occupying with respect to the total surface area of the device is not less than 2.3%.

13. The device according to claim 7, wherein a plane obtained by connecting the apexes of the convex shapes and an interface between the transparent electric conductive oxide N electrode and the semiconductor multi-layer film are in the same plane.

14. The device according to claim 7, wherein the convex shapes are situated above the P-type semiconductor layer.

15. The device according to claim 7, wherein the semiconductor multi-layer film has a total thickness of 20 μm to 80 μm.

16. A method for producing a group III nitride semiconductor light emitting device comprising the steps (II-1) to (II-7):
   step (II-1): a high concentration N-type semiconductor layer having an n-type impurity concentration of $5\times10^{18}$ cm$^{-3}$ to $5\times10^{20}$ cm$^{-3}$, N-type semiconductor layer, light emitting layer and P-type semiconductor layer are allowed to grow in this order on a substrate to obtain a semiconductor multi-layer film,
   step (II-2): a P electrode is formed on the semiconductor multi-layer film,
   step (II-3): a support is joined to the P electrode,
   step (II-4): the substrate is separated from the semiconductor multi-layer film,
   step (II-5): particles having an average particle size of 0.01 μm to 10 μm are placed at an area density of $2\times10^6$ cm$^{-2}$ to $2\times10^{10}$ cm$^{-2}$ on the high concentration N-type semiconductor layer of the semiconductor multi-layer film, step (II-6): the semiconductor multi-layer film is dry-etched using the particles as an etching mask, to form a convex shape, step (II-7): an N electrode is formed on the high concentration N-type semiconductor layer.

17. The method according to claim 16, wherein the particles used in the step (II-5) are made of an inorganic material.

18. The method according to claim 17, wherein the inorganic material is selected from the group consisting of oxides, nitrides, carbides, borides, sulfides, selenides and metals.

19. The method according to claim 18, wherein the inorganic material is an oxide.

20. The method according to claim 19, wherein the oxide is silica.

* * * * *